(12) United States Patent
Yamada et al.

(10) Patent No.: US 7,922,497 B2
(45) Date of Patent: Apr. 12, 2011

(54) ANISOTROPIC CONDUCTIVE CONNECTOR AND INSPECTION EQUIPMENT OF CIRCUIT DEVICE

(75) Inventors: Daisuke Yamada, Hidaka (JP); Kiyoshi Kimura, Hidaka (JP); Fujio Hara, Hidaka (JP)

(73) Assignee: JSR Corporation, Tokyo (JP)

( * ) Notice: Subject to any disclaimer, the term of this patent is extended or adjusted under 35 U.S.C. 154(b) by 425 days.

(21) Appl. No.: 12/089,608

(22) PCT Filed: Sep. 28, 2006

(86) PCT No.: PCT/JP2006/319323

§ 371 (c)(1),
(2), (4) Date: Apr. 9, 2008

(87) PCT Pub. No.: WO2007/043350

PCT Pub. Date: Apr. 19, 2007

(65) Prior Publication Data

US 2009/0230975 A1 Sep. 17, 2009

(30) Foreign Application Priority Data

Oct. 11, 2005 (JP) ................................. 2005-296350

(51) Int. Cl.
*H01R 12/00* (2006.01)
(52) U.S. Cl. ........................................................ 439/66
(58) Field of Classification Search ................. 439/66
See application file for complete search history.

(56) References Cited

U.S. PATENT DOCUMENTS

| 6,524,115 | B1 * | 2/2003 | Gates et al. ...................... 439/66 |
| 7,038,471 | B2 | 5/2006 | Kimura et al. |
| 7,059,874 | B2 * | 6/2006 | Weiss ................................ 439/91 |
| 7,160,123 | B2 | 1/2007 | Yamada et al. |
| 7,190,180 | B2 | 3/2007 | Yamada et al. |
| 7,309,244 | B2 | 12/2007 | Yamada et al. |
| 7,705,618 | B2 * | 4/2010 | Kimura et al. ........... 324/755.08 |
| 2007/0205783 | A1 | 9/2007 | Sato et al. |
| 2008/0054921 | A1 | 3/2008 | Kimura et al. |

FOREIGN PATENT DOCUMENTS

| JP | 2000 180506 | | 6/2000 |
| JP | 2001351702 | * | 9/2000 |
| JP | 2001 351702 | | 12/2001 |
| JP | 2002 139529 | | 5/2002 |
| JP | 2004 172589 | | 6/2004 |

OTHER PUBLICATIONS

U.S. Appl. No. 12/296,530, filed Oct. 9, 2008, Yamada, et al.
U.S. Appl. No. 11/632,287, filed Aug. 3, 2007, Kimura, et al.
U.S. Appl. No. 11/914,758, filed Nov. 19, 2007, Kimura, et al.

* cited by examiner

*Primary Examiner* — Truc T Nguyen
(74) *Attorney, Agent, or Firm* — Oblon, Spivak, McClelland, Maier & Neustadt, L.L.P.

(57) ABSTRACT

An anisotropically conductive connector device and an inspection apparatus for circuit devices including the anisotropically conductive connector device. The anisotropically conductive connector device includes an elastic anisotropically conductive film, including plural conductive path-forming parts each extending in a thickness-wise direction of the film and arranged mutually insulated by an insulating part, a sheet-like connector including an insulating sheet, including a plurality of through-holes each extending in a thickness-wise direction, and plural electrode structures arranged in the respective through-holes in the insulating sheet to protrude from both surfaces of the insulating sheet. The electrode structures are positioned on respective conductive path-forming parts, the insulating sheet is integrally fixed to the insulating part, and the electrode structures include electrode parts that are movable in the thickness-wise direction of the sheet.

8 Claims, 9 Drawing Sheets

(a)

(b)

(c)

(d)

(e)

(a)

(b)

(c)

ly conductive connector device suitable for use in, for example, inspection of circuit devices such as semiconductor integrated circuits, and an inspection apparatus for circuit devices, which is equipped with this anisotropically conductive connector device.

ANISOTROPIC CONDUCTIVE CONNECTOR AND INSPECTION EQUIPMENT OF CIRCUIT DEVICE

TECHNICAL FIELD

The present invention relates to an anisotropically conductive connector device suitable for use in, for example, inspection of circuit devices such as semiconductor integrated circuits, and an inspection apparatus for circuit devices, which is equipped with this anisotropically conductive connector device.

BACKGROUND ART

An anisotropically conductive sheet is a sheet exhibiting conductivity only in its thickness-wise direction or having pressure-sensitive conductive conductor parts exhibiting conductivity only in the thickness-wise direction when they are pressed in the thickness-wise direction. Since such an anisotropically conductive sheet has such features that compact electrical connection can be achieved without using any means such as soldering or mechanical fitting, and that soft connection becomes feasible with mechanical shock or strain absorbed therein, it is widely used as an anisotropically conductive connector for achieving electrical connection between circuit devices, for example, electrical connection between a printed circuit board and a leadless chip carrier, liquid crystal panel or the like, in fields of, for example, electronic computers, electronic digital clocks, electronic cameras and computer key boards.

In electrical inspection of circuit devices such as printed circuit boards and semiconductor integrated circuits, it is conducted to interpose an anisotropically conductive elastomer sheet as a connector between an electrode region of a circuit device, which is an object of inspection, and an inspection electrode region of a circuit board for inspection for the purpose of achieving electrical connection between electrodes to be inspected formed on one surface of the circuit device and inspection electrodes formed on the surface of the circuit board for inspection.

As such anisotropically conductive sheets, there have heretofore been known those of various structures, such as those obtained by uniformly dispersing metal particles in an elastomer (see, for example, Patent Art. 1), those obtained by unevenly dispersing a conductive magnetic metal in an elastomer, thereby forming a great number of conductive path-forming parts each extending in a thickness-wise direction thereof and an insulating part for mutually insulating them (see, for example, Patent Art. 2) and those obtained by defining a difference in level between the surface of each conductive path-forming part and the insulating part (see, for example, Patent Art. 3).

In these anisotropically conductive sheets, conductive particles are contained in an insulating elastic polymeric substance in a state oriented so as to align in the thickness-wise direction, and each conductive path is formed by a chain of a great number of conductive particles.

Such an anisotropically conductive sheet can be produced by, for example, charging a molding material with conductive particles exhibiting magnetism contained in a polymeric substance-forming material, which will become an elastic polymeric substance by being cured, into a molding cavity of a mold to form a molding material layer, and applying a magnetic field to the molding material layer and curing treatment.

However, the use of a conventional anisotropically conductive sheet as a connector in electrical inspection of a circuit device having projected electrodes composed of, for example, a solder involves the following problems.

Namely, when an operation that projected electrodes that are electrodes to be inspected of a circuit device, which is an object of inspection, are brought into contact under pressure with the surface of the anisotropically conductive sheet is conducted repeatedly, permanent deformation by the pressure contact of the projected electrodes, and deformation by abrasion occur on the surface of the anisotropically conductive sheet, and so the electric resistance values of the conductive path-forming parts in the anisotropically conductive sheet are increased, and the electric resistance values of the respective conductive path-forming parts vary, thereby causing a problem that the following inspection of circuit devices becomes difficult.

In addition, particles with a coating layer composed of gold formed thereon are generally used as conductive particles for forming the conductive path-forming parts for the purpose of achieving good conductivity. However, an electrode material (solder) forming electrodes to be inspected in circuit devices migrates to the coating layers on the conductive particles in the anisotropically conductive sheet when electrical inspection of a great number of circuit devices is conducted continuously, whereby the coating layers are modified. As a result, a problem that the conductivity of the conductive path-forming parts is lowered arises.

Further, the use of a conventional anisotropically conductive sheet as a connector in electrical inspection of a circuit device having pad electrodes composed of, for example, aluminum involves the following problems.

Namely, in the circuit device having the pad electrodes, a resist film having a thickness greater than the thickness of each pad electrode is generally formed on the surface of the circuit device. In order to be surely and electrically connected to the pad electrodes of the circuit device, on which such a resist film has been formed, an anisotropically conductive sheet, in which conductive path-forming parts projecting from the surface of an insulating part have been formed, is used. However, when such an anisotropically conductive sheet is used repeatedly, permanent compression deformation occurs on the conductive path-forming parts, so that the electric resistance values of the conductive path-forming parts in the anisotropically conductive sheet are increased, or stable electrical connection of the conductive path-forming parts to the pad electrodes is not achieved. As a result, the electric resistance values between the pad electrodes that are electrodes to be inspected and inspection electrodes in a circuit board for inspection vary, thereby causing a problem that the following inspection of circuit devices becomes difficult.

In order to solve the above-described problems, it is conducted in inspection of a circuit device to fabricate an anisotropically conductive connector device by an anisotropically conductive sheet and a sheet-like connector obtained by arranging a plurality of electrode structures each extending through in a thickness-wise direction of a flexible insulating sheet composed of a resin material in the insulating sheet and bring electrodes to be inspected into contact under pressure with the electrode structures of the sheet-like connector in this anisotropically conductive connector device, thereby achieving electrical connection with the circuit device that is an object of inspection (see, for example, Patent Art. 4).

The sheet-like connector in such an anisotropically conductive connector device is generally produced in the following manner.

As illustrated in FIG. 24(a), a laminate material 90A obtained by forming a metal layer 92 on one surface of an insulating sheet 91 is first provided, and through-holes 98H each extending through in a thickness-wise direction of the insulating sheet 91 are formed in the insulating sheet 91 by laser beam machining, dry etching or the like as illustrated in FIG. 24(b).

As illustrated in FIG. 24(c), a resist film 93 is then formed on the metal layer 92 on the insulating sheet 91, and for example, an electroplating treatment is conducted by using the metal layer 92 as a common electrode, whereby a metal deposit is filled into each of the through-holes 98H in the insulating sheet 91 to form a short circuit part 98 integrally linked to the metal layer 92, and at the same time, form a projected front-surface electrode part 96 integrally linked to the short circuit part 98 on the front surface of the insulating sheet 91.

Thereafter, the resist film 93 is removed from the metal layer 92, and as illustrated in FIG. 24(d), a resist film 94A is formed on the front surface of the insulating sheet 91 including the front-surface electrode parts 96, and moreover resist film portions 94B are formed on the metal layer 92 in accordance with a pattern corresponding to a pattern of back-surface electrode parts to be formed. The metal layer 92 is subjected to an etching treatment to remove exposed portions of the metal layer 92, thereby forming back-surface electrode parts 97 as illustrated in FIG. 24(e), thus resulting in the formation of the electrode structures 95 to obtain the sheet-like connector 90.

However, the above-described anisotropically conductive connector device involves the following problem.

Since it is difficult in fact to supply a current even in current density distribution to the overall surface of the metal layer 92 in the electroplating treatment step of forming the short circuit parts 98 and front-surface electrode parts 96 in the production process of the sheet-like connector 90, the growing rate of the plating layer varies with individual through-holes 98H in the insulating sheet 91 due to the unevenness of the current density distribution, so that a scatter occurs on the projected height of the front-surface electrode parts 96 formed as illustrated in FIG. 25(a). Upon conducting electrical connection of the sheet-like connector 90 to a circuit device 6, the scatter of projected height in the front-surface electrode parts 96 is absorbed by the flexibility that the insulating sheet 91 has as illustrated in FIG. 25(b). In other words, the insulating sheet 91 is distorted according to the degree of scatter of the projected height in the front-surface electrode parts 96, whereby the electrode structures 95 are displaced, so that each of the front-surface electrode parts 96 comes into contact with each of electrodes 7 to be inspected, thereby achieving necessary electrical connection.

However, when the arrangement pitch of the electrodes 7 to be inspected in the circuit device 6 is small, i.e., the arrangement pitch of the electrode structures 95 in the sheet-like connector 90 is small, a ratio of a clearance between electrode structures 95 adjoining each other to the thickness of the insulating sheet 91 becomes small, so that the flexibility of the whole sheet-like connector 90 is greatly lowered. As a result, the scatter of projected height in the front-surface electrode parts 96 is not sufficiently absorbed upon conducting electrical connection of the sheet-like connector 90 to the circuit device 6 as illustrated in FIG. 25(c). In other words, the electrode structures 95 are not sufficiently displaced, so that, for example, a front-surface electrode part 96 (in the drawing, a left-side front-surface electrode part 96) smaller in projected height comes into no contact with the electrode 7 to be inspected, and so it is difficult to achieve stable electrical connection to the electrode 7 to be inspected.

Patent Art. 1: Japanese Patent Application Laid-Open No. 93393/1976;
Patent Art. 2: Japanese Patent Application Laid-Open No. 147772/1978;
Patent Art. 3: Japanese Patent Application Laid-Open No. 250906/1986;
Patent Art. 4: Japanese Patent Application Laid-Open No. 231019/1995.

DISCLOSURE OF THE INVENTION

The present invention has been made on the basis of the foregoing circumstances and has as its first object the provision of an anisotropically conductive connector device, by which a good electrically connected state to a circuit device, which is an object of inspection, can be surely achieved even when the pitch of electrodes to be inspected in the circuit device is extremely small, and the good electrically connected state is stably retained even when it is used under a high-temperature environment.

A second object of the present invention is to provide an inspection apparatus for circuit devices, by which a good electrically connected state to a circuit device, which is an object of inspection, can be surely achieved even when the pitch of electrodes to be inspected in the circuit device is extremely small, and the good electrically connected state is stably retained even when it is used under a high-temperature environment, and thus necessary inspection can be surely executed.

An anisotropically conductive connector device according to the present invention comprises:

an elastic anisotropically conductive film, in which a plurality of conductive path-forming parts formed by causing conductive particles to be contained in an elastic polymeric substance and each extending in a thickness-wise direction of the film are arranged in a state mutually insulated by an insulating part composed of the elastic polymeric substance; and a sheet-like connector composed of an insulating sheet, in which a plurality of through-holes each extending in a thickness-wise direction of the insulating sheet have been formed, and a plurality of electrode structures arranged in the respective through-holes in the insulating sheet so as to protrude from both surfaces of the insulating sheet, wherein the sheet-like connector is provided in a state that each of the electrode structures has been positioned on each of the conductive path-forming parts of the elastic anisotropically conductive film and in a state that the insulating sheet has been integrally fixed to the insulating part of the elastic anisotropically conductive film, and wherein each of the electrode structures is obtained by forming electrode parts having a diameter greater than the diameter of each of the through-holes in the insulating sheet on both ends of a body part inserted into the through-hole in the insulating sheet and is movable in the thickness-wise direction of the insulating sheet.

In the anisotropically conductive connector device according to the present invention, a support for supporting the peripheral edge portion of the elastic anisotropically conductive film may preferably be provided.

Another elastic anisotropically conductive film, in which a plurality of conductive path-forming parts formed by causing conductive particles to be contained in an elastic polymeric substance and each extending in a thickness-wise direction of the film are arranged in the state mutually insulated by an insulating part composed of the elastic polymeric substance, may be provided in a state that each of the conductive path-forming parts has been positioned on each of the electrode structures of the sheet-like connector and in a state that the insulating part has been integrally fixed to the insulating sheet of the sheet-like connector.

An inspection apparatus for circuit boards according to the present invention comprises:

a circuit device for inspection having inspection electrodes arranged corresponding to electrodes to be inspected of a circuit device, which is an object of inspection, and the above-described anisotropically conductive connector device arranged on the circuit board for inspection.

According to the anisotropically conductive connector device of the present invention, each of the electrode structures in the sheet-like connector is movable in the thickness-wise direction of the insulating sheet, so that even when a scatter occurs on the projected height of the electrode parts in the electrode structures, the electrode structure moves in the thickness-wise direction of the insulating sheet according to the projected height of the electrode part thereof when electrodes to be inspected are pressurized. Accordingly, a good electrically connected state to a circuit device can be surely achieved.

In addition, each of the electrode parts in the electrode structure has a diameter greater than the diameter of the through-hole in the insulating sheet, so that the electrode parts each functions as a stopper. As a result, the electrode structures can be prevented from falling off from the insulating sheet.

Further, the insulating sheet of the sheet-like connector is integrally fixed to the insulating part of the elastic anisotropically conductive film, so that occurrence of positional deviation between the electrode structures of the sheet-like connector and the conductive path-forming parts of the elastic anisotropically conductive film due to a difference in the coefficient of thermal expansion between a material for forming the elastic anisotropically conductive film and a material for forming the insulating sheet is prevented even when the anisotropically conductive connector device is used under a high-temperature environment. Accordingly, a good electrically connected state is stably retained.

According to the inspection apparatus for circuit devices of the present invention, the apparatus is equipped with the above-described anisotropically conductive connector device, so that a good electrically connected state to a circuit device, which is an object of inspection, can be surely achieved even when the pitch of electrodes to be inspected in the circuit device is extremely small, and the good electrically connected state is stably retained even when it is used under a high-temperature environment, and thus necessary inspection can be surely executed.

DESCRIPTION OF CHARACTERS

| | DESCRIPTION OF CHARACTERS |
|---|---|
| 1 | Circuit device |
| 2 | Electrodes to be inspected |
| 6 | Circuit device |
| 7 | Electrodes to be inspected |
| 10 | Anisotropically conductive connector device |
| 10A, 10C | Elastic anisotropically conductive films |
| 10B | Molding material layer |
| 11 | Conductive path-forming parts |
| 12 | Unavailable conductive path-forming parts |
| 11A, 12A | Projected parts |
| 14 | Insulating part |
| 15 | Adhesive layer |
| 16 | Conductive path-forming parts |
| 16A, 16B | Projected parts |
| 17 | Insulating part |
| 18 | Adhesive layer |
| 20 | Sheet-like probe |
| 20A | Composite laminate material |
| 20B | Laminate material |
| 21 | Insulating sheet |
| 21H | Through-holes |
| 22 | Electrode structures |
| 22a | Body parts |
| 22b, 22c | Electrode parts |
| 23A | Metal layer |
| 23B | Thin metal layers |
| 23K | Opening |
| 24 | Resist films |
| 24H | Pattern hole |
| 30 | Support |
| 31 | Opening |
| 32 | Positioning holes |
| 40 | Circuit board for inspection |
| 41 | Inspection electrodes |
| 42 | Guide pins |
| 45 | Thermostatic oven |
| 46 | DC power source |
| 47 | Constant-current controller |
| 48 | Voltmeter |
| 50 | Top force |
| 51 | Ferromagnetic substance substrate |
| 52 | Ferromagnetic substance layers |
| 53 | Non-magnetic substance layers |
| 54 | Recess |
| 55 | Bottom force |
| 56 | Ferromagnetic substance substrate |
| 57 | Ferromagnetic substance layers |
| 58 | Non-magnetic substance layers |
| 59 | Recess |
| 60, 61 | Spacers |
| 90 | Sheet-like connector |
| 90A | Laminate material |
| 91 | Insulating sheet |
| 92 | Metal layer |
| 93 | Resist film |
| 94A, 94B | Resist films |
| 95 | Electrode structures |
| 96 | Front-surface electrode parts |
| 97 | Back-surface electrode parts |
| 98 | Short circuit parts |
| 98H | Through-holes |
| P | Conductive particles |

BEST MODE FOR CARRYING OUT THE INVENTION

The embodiments of the present invention will hereinafter be described in details.

Figure 1:
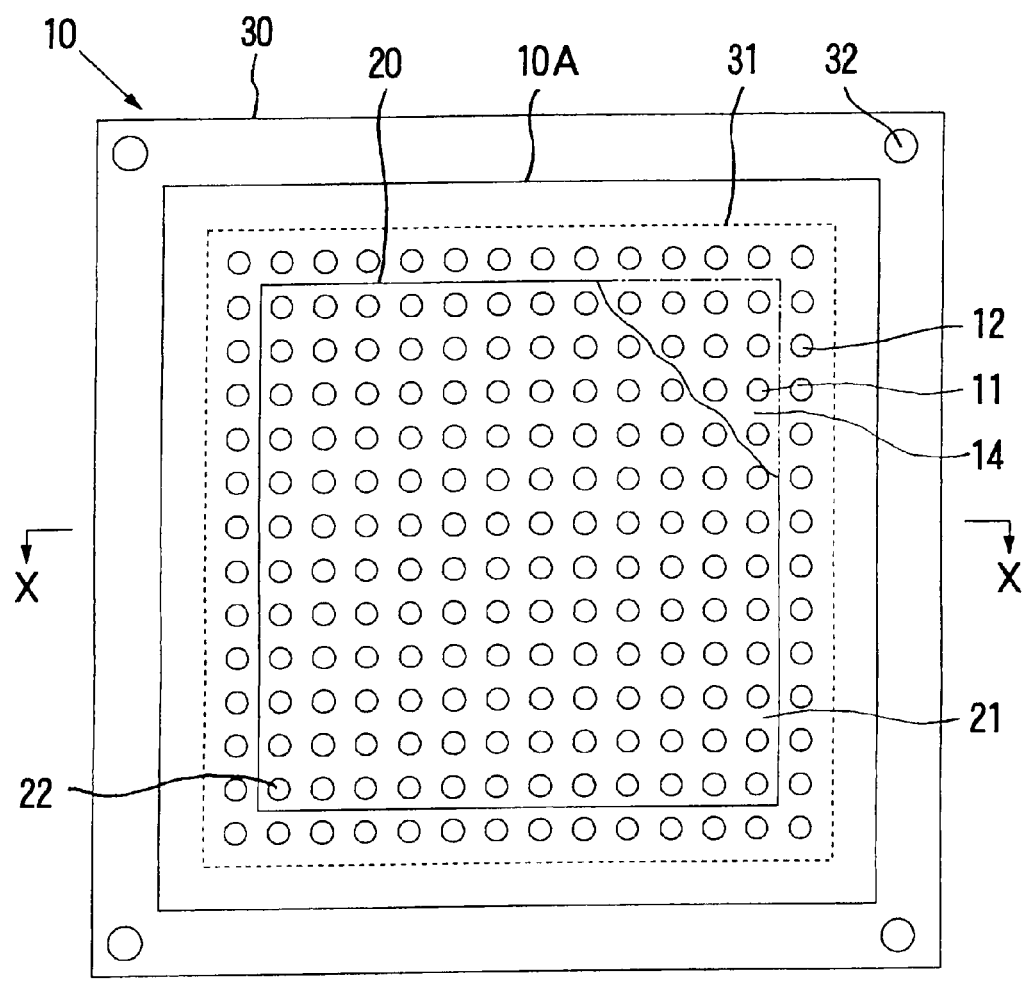
[FIG. 1] is a plan view illustrating an exemplary anisotropically conductive connector device according to the present invention.
Figure 2:
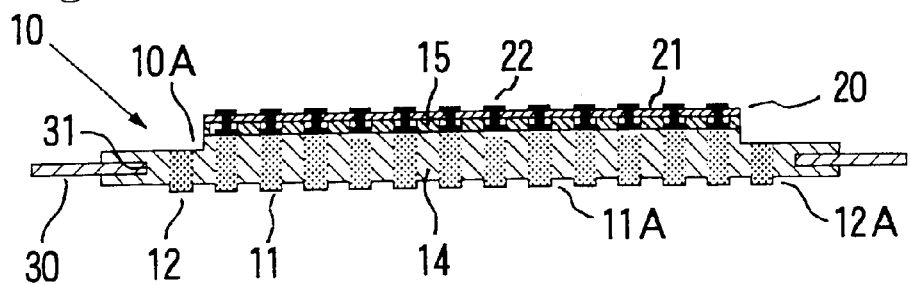
[FIG. 2] is a cross-sectional view taken along line X-X of the anisotropically conductive connector device shown in FIG. 1.
Figure 3:
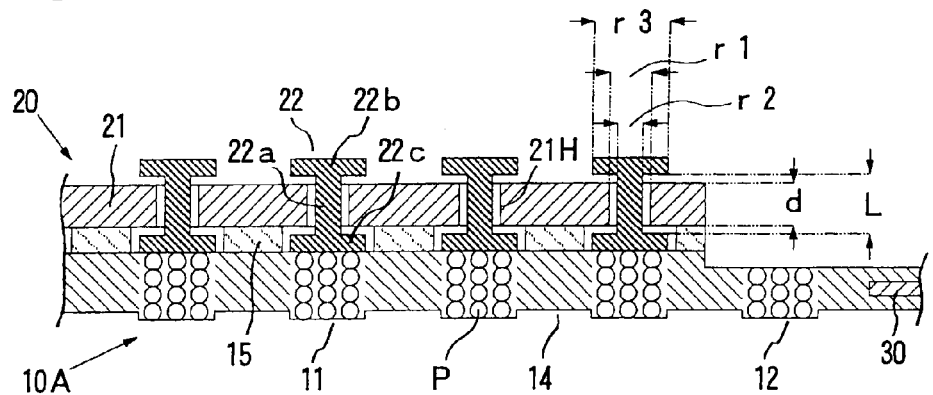
[FIG. 3] illustrates, on an enlarged scale, a part of the X-X section of the anisotropically conductive connector device shown in FIG. 1.

FIGS. 1 to 3 illustrate the construction of an exemplary anisotropically conductive connector device according to the present invention, FIG. 1 is a plan view of an anisotropically conductive connector device, FIG. 2 is a cross-sectional view taken along line X-X of the anisotropically conductive connector device shown in FIG. 1, and FIG. 3 illustrates, on an enlarged scale, a part of the X-X section of the anisotropically conductive connector device shown in FIG. 1. This anisotropically conductive connector device 10 is used in electrical inspection of circuit devices such as IC and LSI and is composed of a rectangular elastic anisotropically conductive film 10A, a sheet-like connector 20 integrally provided on one surface of this elastic anisotropically conductive film 10A and a support 30 in the form of a plate for supporting the elastic anisotropically conductive film 10A.

The elastic anisotropically conductive film 10A in this anisotropically conductive connector device 10 has a plurality of columnar conductive path-forming parts 11 each extending in a thickness-wise direction thereof and an insulating part 14 mutually insulating these conductive path-forming parts 11, and the conductive path-forming parts 11 are arranged in accordance with a pattern corresponding to a pattern of electrodes to be inspected.

The elastic anisotropically conductive film 10A is formed by an insulating elastic polymeric substance as a whole, and conductive particles P exhibiting magnetism are contained in the conductive path-forming parts 11 thereof in a state oriented so as to align in the thickness-wise direction. On the other hand, the conductive particles are not present at all or scarcely present in the insulating part 14.

In the embodiment illustrated, a central portion of one surface of the elastic anisotropically conductive film 10A is formed in a state projected from the peripheral edge portion thereof, the conductive path-forming parts 11 are formed at this central portion, and unavailable conductive path-forming parts 12 not electrically connected to electrodes to be inspected are formed at the peripheral edge portion in the elastic anisotropically conductive film 10A.

In the anisotropically conductive connector device 10 of this embodiment, projected parts 11A and 12A protruding from the surface of the insulating part 14 are formed at the surfaces of the conductive path-forming parts 11 and unavailable conductive path-forming parts 12 on the other surfaces of the elastic anisotropically conductive film 10A.

The sheet-like connector 20 is constructed by an insulating sheet 21, in which a plurality of through-holes 21H each extending in a thickness-wise direction of the sheet have been formed in accordance with a pattern corresponding to a pattern of electrode to be inspected of a circuit device, which is an object of inspection, and a plurality of electrode structures 22 arranged in the respective through-holes 21H in this insulating sheet 21 so as to protrude from both surfaces of the insulating sheet 21.

Each of the electrode structures 22 is formed by a columnar body part 22a inserted into the through-hole 21H in the insulating sheet 21 and electrode parts 22b and 22c formed in a state integrally linked to both ends of this body part 22a and exposed to the surfaces of the insulating sheet 21. The length L of the body part 22a in the electrode structure 22 is greater than the thickness d of the insulating sheet 21, and the diameter r2 of the body part 22a is smaller than the diameter r1 of the through-hole 21H in the insulating sheet 21, whereby the electrode structure 22 is movable in the thickness-wise direction of the insulating sheet 21. The diameter r3 of each of the electrode parts 22b, 22c in the electrode structure 22 is greater than the diameter r1 of the through-hole 21H in the insulating sheet 21.

The sheet-like connector 20 is provided in a state that each of the electrode structures 22 has been positioned on each of the conductive path-forming parts 11 of the elastic anisotropically conductive film 10A and in a state that the insulating sheet 21 has been integrally fixed to the insulating part 14 of the elastic anisotropically conductive film 10A through an adhesive layer 15.

Figure 4:
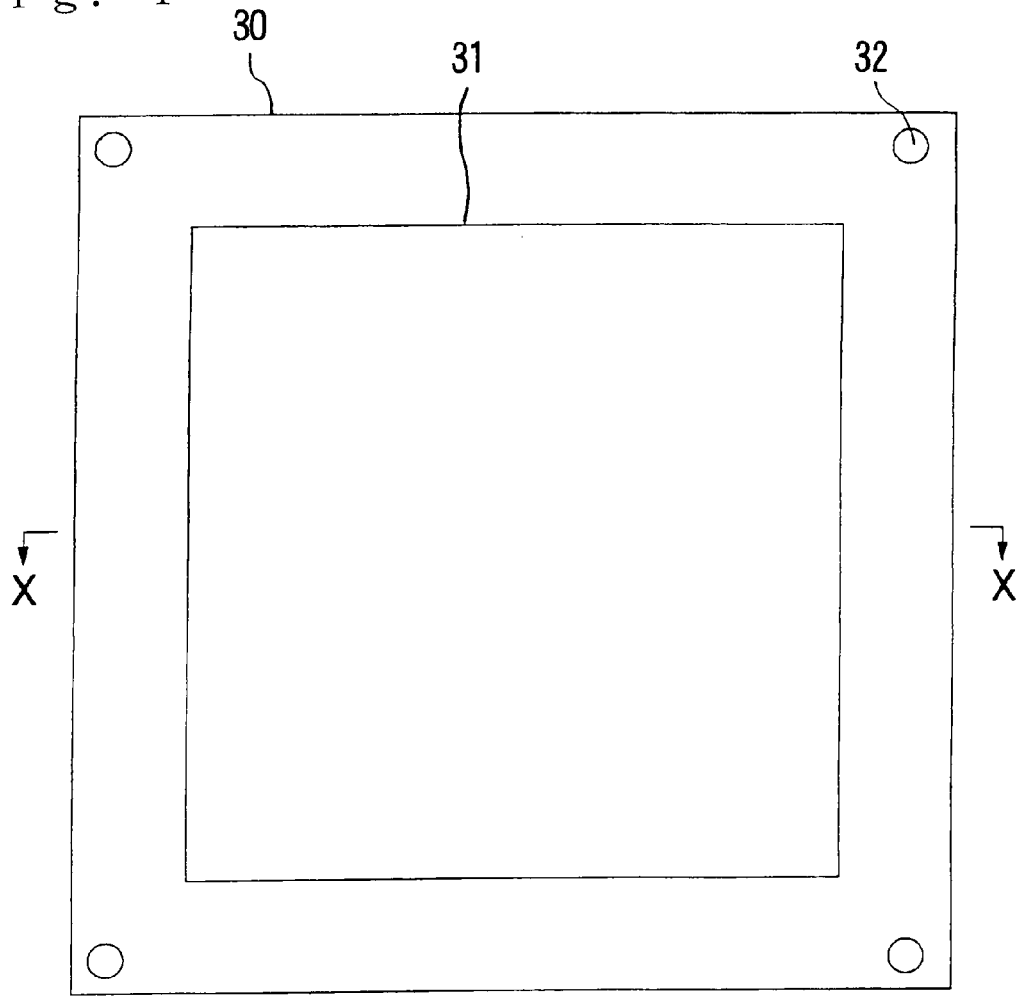
[FIG. 4] is a plan view of a support in the anisotropically conductive connector device shown in FIG. 1.
Figure 5:
[FIG. 5] is a cross-sectional view taken along line X-X of the support shown in FIG. 4.

In the support 30, as also illustrated in FIGS. 4 and 5, a rectangular opening 31 having a size smaller than the elastic anisotropically conductive film 10A is formed at a central position thereof, and positioning holes 32 are respectively formed at positions of four corners thereof.

The elastic anisotropically conductive film 10A is arranged in the opening 31 of the support 30 and supported by the support 30 by fixing the peripheral edge portion of the elastic anisotropically conductive film 10A to the support 30.

In the elastic anisotropically conductive film 10A, the thickness of the conductive path-forming parts 11 is, for example, 0.1 to 2 mm, preferably 0.2 to 1 mm.

The diameter of the conductive path-forming parts 11 is suitably preset according to the pitch of electrodes to be inspected, and the like and is, for example, 50 to 1,000 μm, preferably 200 to 800 μm.

The projected height of the projected parts 11A and 12A is, for example, 10 to 100 μm, preferably 20 to 60 μm.

In the sheet-like connector 20, the thickness d of the insulating sheet 21 is preferably 10 to 200 μm, more preferably 15 to 100 μm.

The diameter r1 of the through-holes 21H in the insulating sheet 21 is preferably 20 to 250 μm, more preferably 30 to 150 μm.

The diameter r2 of the body part 22a in the electrode structure 22 is preferably 18 μm or more, more preferably 25 μm or more. If this diameter r2 is too small, strength required of the electrode structure 22 may not be achieved in some cases. A difference (r1−r2) between the diameter r1 of the through-hole 21H in the insulating sheet 21 and the diameter r2 of the body part 22a in the electrode structure 22 is preferably 1 μm or more, more preferably 2 μm or more. If this difference is too small, it may be difficult in some cases to move the electrode structure 22 in the thickness-wise direction of the insulating sheet 21.

A difference (r3−r1) between the diameter r3 of the electrode parts 22b and 22c in the electrode structure 22 and the diameter r1 of the through-hole 21H in the insulating sheet 21 is preferably 5 μm or more, more preferably 10 μm or more. If this difference is too small, the electrode structures 22 may possibly fall off from the insulating sheet 21.

A movable distance of each of the electrode structures 22 in the thickness-wise direction of the insulating sheet 21, i.e., a difference (L−d) between the length L of the body part 22a in the electrode structure 22 and the thickness d of the insulating sheet 21 is preferably 5 to 50 μm, more preferably 10 to 40 μm. If the movable distance of the electrode structure 22 is too small, it may be difficult in some cases to achieve sufficient irregularity-absorbing property. If the movable distance of the electrode structure 22 is too great on the other hand, the length of the body part 22a of the electrode structure 22, which is exposed from the through-hole 21H in the insulating sheet 21 becomes great, so that the body part 22a of the electrode structure 22 may possibly be buckled or damaged when the sheet-like connector is used in inspection.

The thickness of the support 30 is, for example, 0.01 to 1 mm, preferably 0.05 to 0.8 mm.

The durometer hardness of an elastic polymeric substance forming the elastic anisotropically conductive film 10A is preferably 15 to 70, more preferably 25 to 65. If this durometer hardness is too low, high repetitive durability may not be achieved in some cases. If this durometer hardness is too high on the other hand, conductive path-forming parts having high conductivity may not be obtained in some cases.

The elastic polymeric substance forming the elastic anisotropically conductive film 10A is preferably a polymeric substance having a crosslinked structure. As curable polymeric substance-forming materials usable for obtaining such an elastic polymeric substance, may be used various materials. Specific examples thereof include conjugated diene rubbers such as polybutadiene rubber, natural rubber, polyisoprene rubber, styrene-butadiene copolymer rubber and acrylonitrile-butadiene copolymer rubber, and hydrogenated products thereof; block copolymer rubbers such as styrene-butadiene-diene block terpolymer rubber and styrene-isoprene block copolymers, and hydrogenated products thereof; and besides chloroprene rubber, urethane rubber, polyester rubber, epichlorohydrin rubber, silicone rubber, ethylene-propylene copolymer rubber and ethylene-propylene-diene terpolymer rubber.

When weather resistance is required of the resulting anisotropically conductive connector 10 in the embodiment described above, any other material than conjugated diene rubbers is preferably used. In particular, silicone rubber is preferably used from the viewpoints of molding and processing ability and electrical properties.

As the silicone rubber, is preferred that obtained by crosslinking or condensing liquid silicone rubber. The liquid silicone rubber preferably has a viscosity not higher than $10^5$ poises as measured at a shear rate of $10^{-1}$ sec and may be any of condensation type, addition type and those having a vinyl group or hydroxyl group. As specific examples thereof, may be mentioned dimethyl silicone raw rubber, methylvinyl silicone raw rubber and methylphenylvinyl silicone raw rubber.

The silicone rubber preferably has a molecular weight Mw (weight average molecular weight as determined in terms of standard polystyrene; the same shall apply hereinafter) of 10,000 to 40,000. It also preferably has a molecular weight distribution index (a ratio Mw/Mn of weight average molecular weight Mw as determined in terms of standard polystyrene to number average molecular weight Mn as determined in terms of standard polystyrene; the same shall apply hereinafter) of at most 2 because good heat resistance can be given to the resulting conductive path-forming parts 11.

As the conductive particles contained in the conductive path-forming parts 11 in the elastic anisotropically conductive film 10A, conductive particles exhibiting magnetism are used in that such particles can be easily oriented by a process, which will be described subsequently. Specific examples of such conductive particles include particles of metals exhibiting magnetism, such as iron, cobalt and nickel, particles of alloys thereof, particles containing such a metal, particles obtained by using these particles as core particles and plating surfaces of the core particles with a metal having good conductivity, such as gold, silver, palladium or rhodium, and particles obtained by using particles of a non-magnetic metal, particles of an inorganic substance, such as glass beads, or particles of a polymer as core particles and plating surfaces of the core particles with a conductive magnetic metal such as nickel or cobalt.

Among these, particles obtained by using nickel particles as core particles and plating their surfaces with gold having good conductivity are preferably used.

No particular limitation is imposed on the means for coating the surfaces of the core particles with the conductive metal. However, for example, a chemical plating, electroplating, sputtering or vapor deposition process is used.

When those obtained by coating the surfaces of the core particles with the conductive metal are used as the conductive particles, the coating rate (proportion of an area coated with the conductive metal to the surface area of the core particles)

of the conductive metal on the particle surfaces is preferably at least 40%, more preferably at least 45%, particularly preferably 47 to 95% from the viewpoint of achieving good conductivity.

The amount of the conductive metal to coat is preferably 0.5 to 50% by mass, more preferably 2 to 30% by mass, still more preferably 3 to 25% by mass, particularly preferably 4 to 20% by mass based on the core particles. When the conductive metal to coat is gold, the coating amount thereof is preferably 0.5 to 30% by mass, more preferably 2 to 20% by mass, still more preferably 3 to 15% by mass based on the core particles.

The particle diameter of the conductive particles is preferably 1 to 100 μm, more preferably 2 to 50 μm, still more preferably 3 to 30 μm, particularly preferably 4 to 20 μm.

The particle diameter distribution (Dw/Dn) of the conductive particles is preferably 1 to 10, more preferably 1.01 to 7, still more preferably 1.05 to 5, particularly preferably 1.1 to 4.

When conductive particles satisfying such conditions are used, the resulting conductive path-forming parts 11 become easy to deform under pressure, and sufficient electrical contact is achieved among the conductive particles in the conductive path-forming parts 11.

No particular limitation is imposed on the form of the conductive particles. However, they are preferably in the form of a sphere or star, or secondary particles obtained by aggregating these particles from the viewpoint of permitting easy dispersion of these particles in the polymeric substance-forming material.

Those obtained by treating surfaces of the conductive particles with a coupling agent such as a silane coupling agent, or a lubricant may be suitably used. By treating the surfaces of the particles with the coupling agent or lubricant, the durability of the resulting anisotropically conductive connector is improved.

Such conductive particles are preferably used in a proportion of 5 to 60%, more preferably 7 to 50% in terms of volume fraction to the polymeric substance-forming material. If this proportion is lower than 5%, conductive path-forming parts 11 sufficiently low in electric resistance value may not be obtained in some cases. If this proportion exceeds 60% on the other hand, the resulting conductive path-forming parts 11 are liable to be brittle, so that elasticity required of the conductive path-forming parts 11 may not be achieved in some cases.

As a material for forming the adhesive layer 15, may be preferably used a material having elasticity.

As specific examples thereof, may be mentioned those exemplified as the elastic polymeric substance forming the elastic anisotropically conductive film. In particular, silicone rubber is preferred.

As a material for forming the insulating sheet 21 in the sheet-like connector 20, may be used a resin material such as a liquid crystal polymer, polyimide resin, polyester resin, polyaramide resin or polyamide resin, a fiber-reinforced resin material such as a glass fiber-reinforced epoxy resin, glass fiber-reinforced polyester resin or glass fiber-reinforced polyimide resin, or a composite resin material with an inorganic material such as alumina or boron nitride contained as a filler in an epoxy resin or the like.

When the anisotropically conductive connector device 10 is used under a high-temperature environment, that having a coefficient of linear thermal expansion of at most $3\times10^{-5}$/K, more preferably $1\times10^{-6}$ to $2\times10^{-5}$/K, particularly preferably $1\times10^{-6}$ to $6\times10^{-6}$/K is preferably used as the insulating sheet 21. When such an insulating sheet 11 is used, positional deviation of the electrode structures 22 due to thermal expansion of the insulating sheet 11 is inhibited.

As a material for forming the electrode structures 22, may be suitably used a metallic material. In particular, a material harder to be etched than a thin metal layer formed on the insulating sheet 21 in a production process, which will be described subsequently, is preferably used. As specific examples of such a metallic material, may be mentioned simple metals such as nickel, cobalt, gold and aluminum, and alloys of these metals.

As a material for forming the support 30, is preferably used that having a coefficient of linear thermal expansion of at most $3\times10^{-5}$/K, more preferably $2\times10^{-5}$ down to $1\times10^{-6}$/K, particularly preferably $6\times10^{-6}$ down to $1\times10^{-6}$/K.

As a specific material, a metallic material or non-metallic material is used.

As the metallic material, may be used gold, silver, copper, iron, nickel, cobalt or an alloy thereof.

As the non-metallic material, may be used a resin material having high mechanical strength, such as a polyimide resin, polyester resin, polyaramide resin or polyamide resin, a composite resin material such as a glass fiber-reinforced epoxy resin, glass fiber-reinforced polyester resin or glass fiber-reinforced polyimide resin, or another composite resin material with an inorganic material such as silica, alumina or boron nitride mixed as a filler into an epoxy resin or the like. Among these, the polyimide resin, the composite resin material such as the glass fiber-reinforced epoxy resin, or the composite resin material such as an epoxy resin with boron nitride mixed as a filler therein is preferred in that it is low in coefficient of linear thermal expansion.

In the present invention, the elastic anisotropically conductive film 10A can be produced, for example, in the following manner.

Figure 6:
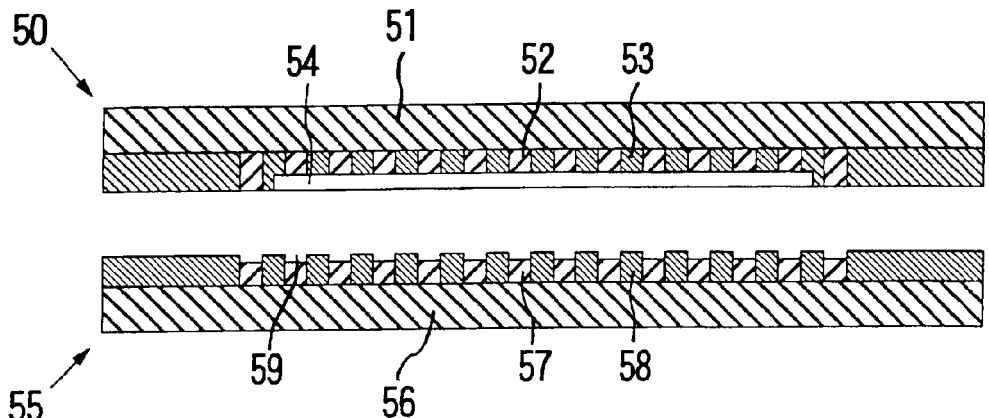
[FIG. 6] is a cross-sectional view illustrating the construction of an exemplary mold for molding an elastic anisotropically conductive film.

FIG. 6 is a cross-sectional view illustrating the construction of an exemplary mold used for producing the elastic anisotropically conductive film. This mold is so constructed that a top force 50 and a bottom force 55 making a pair therewith are arranged so as to be opposed to each other. A molding cavity is defined between a molding surface (lower surface in FIG. 6) of the top force 50 and a molding surface (upper surface in FIG. 6) of the bottom force 55.

In the top force 50, ferromagnetic substance layers 52 are formed on a surface (lower surface in FIG. 6) of a ferromagnetic substance substrate 51 in accordance with an arrangement pattern corresponding to a pattern of the conductive path-forming parts 11 and unavailable conductive path-forming parts 12 in the intended elastic anisotropically conductive film 10A, and non-magnetic substance layers 53 are formed at other places than the ferromagnetic substance layers 52. The molding surface is formed by the ferromagnetic substance layers 52 and non-magnetic substance layers 53. A difference in level is defined at the molding surface of the top force 50 to form a recess 54.

In the bottom force 55 on the other hand, ferromagnetic substance layers 57 are formed on a surface (upper surface in FIG. 6) of a ferromagnetic substance substrate 56 in accordance with a pattern corresponding to the pattern of the conductive path-forming parts 11 and unavailable conductive path-forming parts 12 in the intended elastic anisotropically conductive film 10A, and non-magnetic substance layers 58 having a thickness greater than the thickness of the ferromagnetic substance layers 57 are formed at other places than the ferromagnetic substance layers 57. A difference in level is defined between the non-magnetic substance layers 58 and the ferromagnetic substance layers 57, whereby recessed portions 59 for forming projected parts 11A, 12A in the elastic anisotropically conductive film 10A are formed in the molding surface of the bottom force 55.

As a material for forming the respective ferromagnetic substance substrates 51 and 56 in the top force 50 and bottom force 55, may be used a ferromagnetic metal such as iron, iron-nickel alloy, iron-cobalt alloy, nickel or cobalt. The ferromagnetic substance substrates 51 and 56 preferably have a thickness of 0.1 to 50 mm, and are preferably smooth at surfaces thereof and subjected to a chemical degreasing treatment or mechanical polishing treatment.

As a material for forming the ferromagnetic substance layers 52 and 57 in both top force 50 and bottom force 55, may be used a ferromagnetic metal such as iron, iron-nickel alloy, iron-cobalt alloy, nickel or cobalt. The ferromagnetic substance layers 52 and 57 preferably have a thickness of 10 µm or more. If this thickness is smaller than 10 µm, it is difficult to apply a magnetic field having sufficient intensity distribution to a molding material layer formed within the mold. As a result, it is difficult to gather the conductive particles at a high density at portions to become the conductive path-forming parts 11 in the molding material layer, and so a good anisotropically conductive connector may not be provided in some cases.

As a material for forming the non-magnetic substance layers 53 and 58 in both top force 50 and bottom force 55, may be used a non-magnetic metal such as copper, a polymeric substance having heat resistance, or the like. However, a polymeric substance cured by radiation is preferably used in that the non-magnetic substance layers 53 and 58 can be easily formed by a technique of photolithography. As a material thereof, may be used, for example, a photoresist such as an acrylic type dry film resist, epoxy type liquid resist or polyimide type liquid resist.

The thickness of the non-magnetic substance layers 58 in the bottom force 55 is preset according to the projected height of the projected parts 11A and 12A to be formed and the thickness of the ferromagnetic substance layers 57.

The above-described mold is used to produce the elastic anisotropically conductive film 10A, for example, in the following manner.

Figure 7:
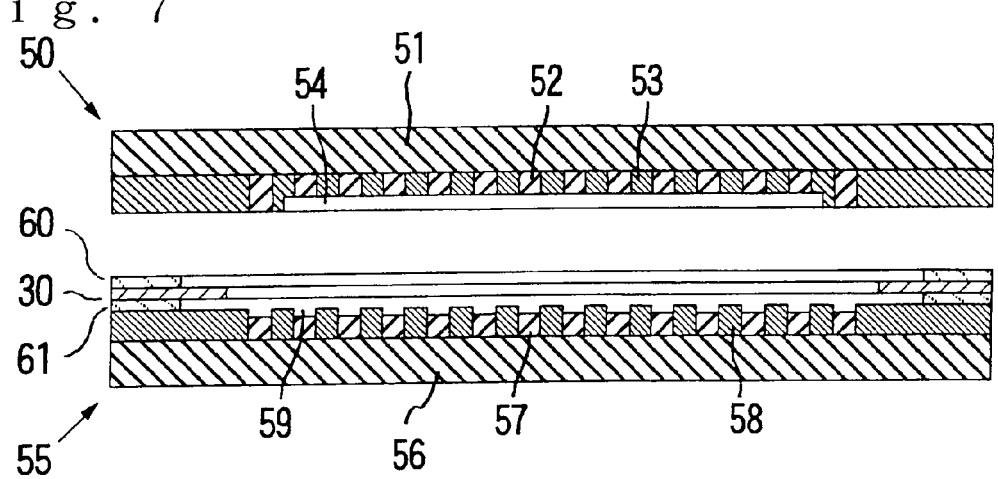
[FIG. 7] is a cross-sectional view illustrating a state that spacers and a support have been arranged on the molding surface of a bottom force.

As illustrated in FIG. 7, two frame-like spacers 60 and 61 and a support 30 are provided, and the support 30 is fixed and arranged at a predetermined position of the bottom force 55 through the spacer 61. Further, the spacer 60 is arranged on the support 30.

On the other hand, conductive particles exhibiting magnetism are dispersed in a liquid polymeric substance-forming material, which will become an elastic polymeric substance by being cured, thereby preparing a molding material for forming the elastic anisotropically conductive film.

Figure 8:
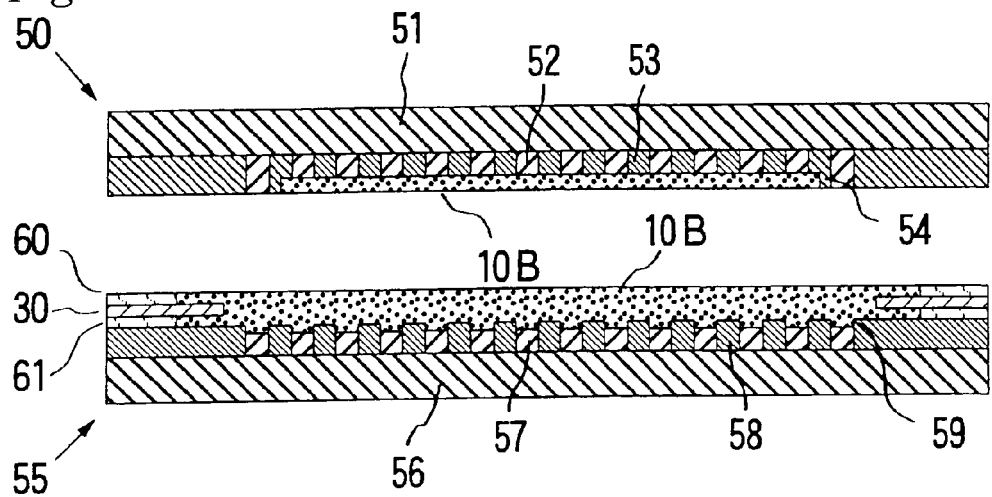
[FIG. 8] is a cross-sectional view illustrating a state that molding material layers have been formed on both top force and bottom force.
Figure 9:
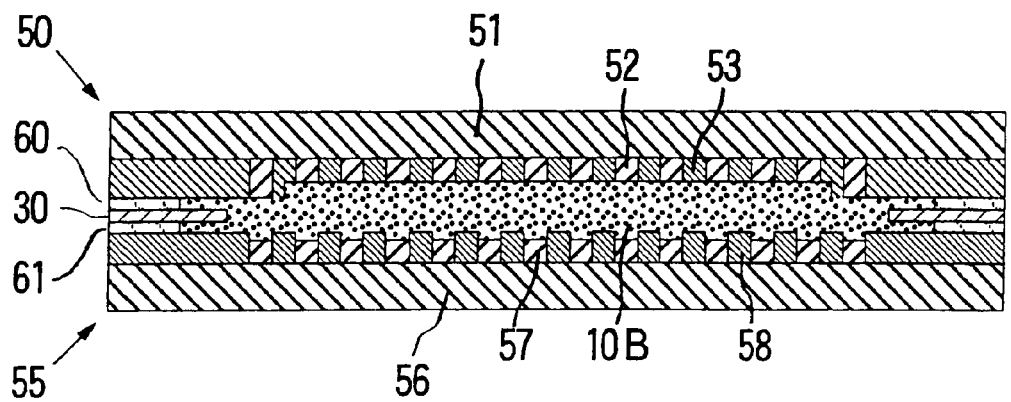
[FIG. 9] is a cross-sectional view illustrating a state that a molding material layer of the intended form has been formed.
Figure 10:
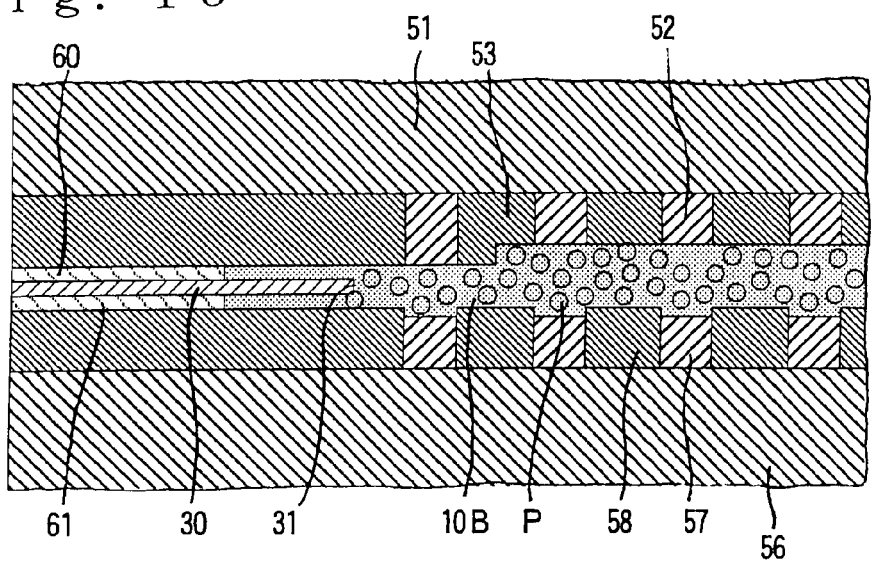
[FIG. 10] is a cross-sectional view illustrating, on an enlarged scale, a part of the molding material layer.

As illustrated in FIG. 8, the molding material is then charged into the recess 54 of the top force 50, thereby forming a molding material layer 10B with the conductive particles exhibiting magnetism contained in the polymeric substance-forming material, and at the same time, the molding material is charged into a cavity defined by the bottom force 55, the spacers 60 and 61, and the support 30, thereby forming a molding material layer 10B with the conductive particles exhibiting magnetism contained in the polymeric substance-forming material. The top force 50 is then arranged in alignment on the spacer 60, thereby forming a molding material layer 10B of a final form within the mold as illustrated in FIG. 9. In the molding material layer 10B, the conductive particles P are in a state dispersed in the molding material layer 10B.

Figure 11:
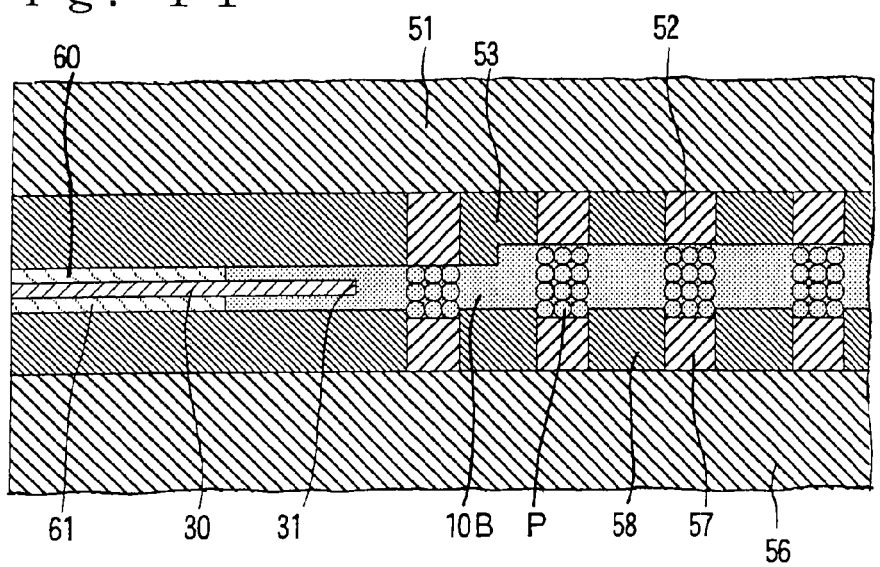
[FIG. 11] is a cross-sectional view illustrating a state that a magnetic field has been applied to the molding material layer.

Electromagnets (not illustrated) arranged on the upper surface of the ferromagnetic substance substrate 51 in the top force 50 and on the lower surface of the ferromagnetic substance substrate 56 in the bottom force 55 are operated, whereby a parallel magnetic field having a strength distribution, i.e., a parallel magnetic field having higher intensity at portions between the ferromagnetic substance layers 52 of the top force 50 and their corresponding ferromagnetic substance layers 57 of the bottom force 55, is applied to the molding material layer 10B in a thickness-wise direction thereof. As a result, in the molding material layer 10B, the conductive particles P dispersed in the molding material layer 10B are gathered at portions to become the conductive path-forming parts 11 and portions to become the unavailable conductive path-forming parts 12, which are located between the respective ferromagnetic substance layers 52 of the top force 50 and their corresponding ferromagnetic substance layers 57 of the bottom force 55, and oriented so as to align in a thickness-wise directions of the molding material layer 10B as illustrated in FIG. 11.

In this state, the molding material layer 10B is subjected to a curing treatment, whereby the elastic anisotropically conductive film 10A having the conductive path-forming parts 11 and unavailable conductive path-forming parts 12, in which the conductive particles are densely charged in the elastic polymeric substance in a state oriented so as to align in the thickness-wise direction, and the insulating part 14 formed so as to surround these parts and composed of the insulating elastic polymeric substance, in which the conductive particles are not present at all or scarcely present, is obtained in a state that the peripheral edge portion thereof has been fixed and supported by the support 30.

In the above-described process, the curing treatment of the molding material layer 10B may be conducted in a state that the parallel magnetic field has been applied as it is, or may also be conducted after the application of the parallel magnetic field has been stopped.

The intensity of the parallel magnetic field applied to the molding material layer is preferably an intensity that it amounts to 20,000 to 1,000,000 µT on the average.

As a means for applying the parallel magnetic field to the polymeric material layer, permanent magnets may also be used in place of the electromagnets. As the permanent magnets, are preferred those composed of alunico (Fe—Al—Ni—Co alloy), ferrite or the like in that the intensity of the parallel magnetic field within the above range is achieved.

The curing treatment of the molding material layer 10B is suitably selected according to the material used. However, the treatment is generally conducted by a heat treatment. Specific heating temperature and heating time are suitably selected in view of the kinds of the polymeric substance-forming material making up the molding material layer, and the like, the time required for movement of the conductive particles, etc.

In the present invention, the sheet-like connector 20 can be produced, for example, in the following manner.

Figure 12:
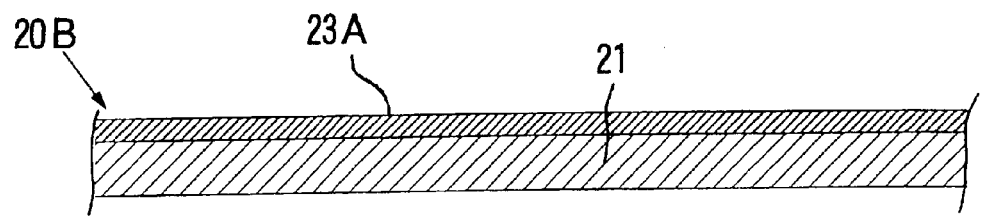
[FIG. 12] is a cross-sectional view illustrating the construction of a laminate material for producing a sheet-like connector.
Figure 13:
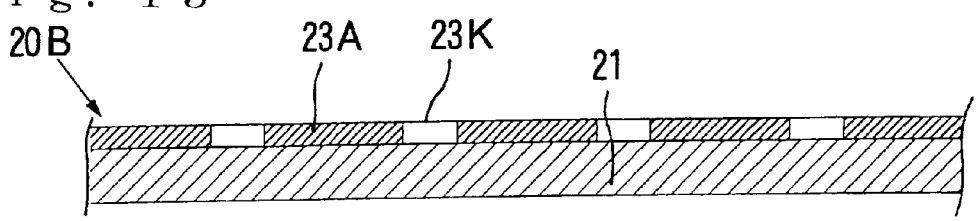
[FIG. 13] is a cross-sectional view illustrating a state that openings have been formed in a metal layer in the laminate material.
Figure 14:
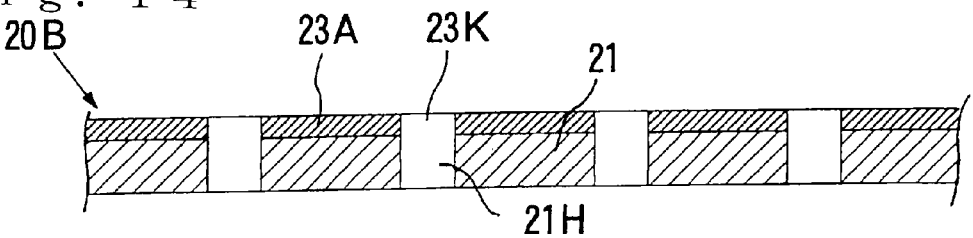
[FIG. 14] is a cross-sectional view illustrating a state that through-holes have been formed in an insulating sheet in the laminate material.
Figure 15:
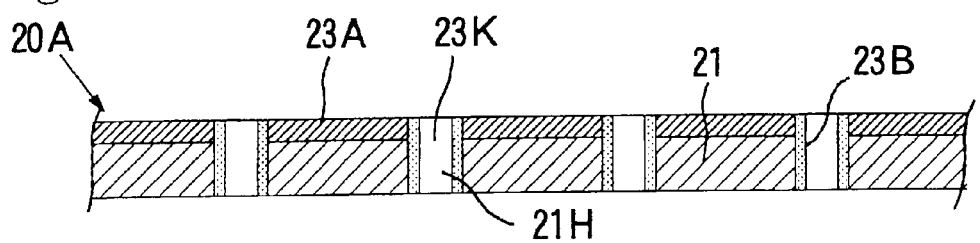
[FIG. 15] is a cross-sectional view illustrating the construction of a composite laminate material.

A laminate material 20B obtained by integrally laminating an easily etchable metal layer 23A on one surface of an insulating sheet 21 is first provided as illustrated in FIG. 12, and the metal layer 23A in this laminate material 20B is subjected to an etching treatment to remove a part thereof, thereby forming a plurality of openings 23K in the metal layer 23A in accordance with a pattern corresponding to a pattern of electrodes to be inspected as illustrated in FIG. 13. Through-holes 21H respectively linked to the openings 23K in the metal layer 23A and each extending in a thickness-wise direction of the insulating sheet are then formed in the insulating sheet 21 in the laminate material 20B as illustrated in FIG. 14. Easily etchable cylindrical thin metal layers 23B are then formed so as to cover the inner wall surfaces of the through-holes 21H in the insulating support sheet 21 and the opening edges of the metal layer 23A as illustrated in FIG. 15. In such a manner, a composite laminate material 20A having the insulating sheet 21, in which the plurality of through-holes 21H each extending in the thickness-wise direction have been formed, the easily etchable metal layer 23A laminated on one surface of the insulating sheet 21 and having the plurality of openings 23K respectively linked to the through-holes 21H in the insulating sheet 21, and the easily etchable thin metal layers 23B each formed so as to cover the inner wall surface of the through-hole 21H in the insulating sheet 21 and the opening edge of the metal layer 23A is produced.

In the above-described process, as a method for forming the through-holes 21H in the insulating sheet 21, may be used a laser beam machining method, drill machining method, etching method or the like.

As an easily etchable metallic material for forming the metal layer 23A and the thin metal layers 23B, may be used copper or the like.

The thickness of the metal layer 23A is preset in view of the intended movable distance of each of the electrode structures 22. Specifically, the thickness is preferably 5 to 70 μm, more preferably 8 to 50 μm.

The thickness of each thin metal layer 23B is preset in view of the diameter of the through-hole 21H in the insulating sheet 21 and the diameter of the body part 22a in each of the electrode structures 22 to be formed.

As a method for forming the thin metal layers 23B, may be used an electroless plating method or the like.

Figure 16:
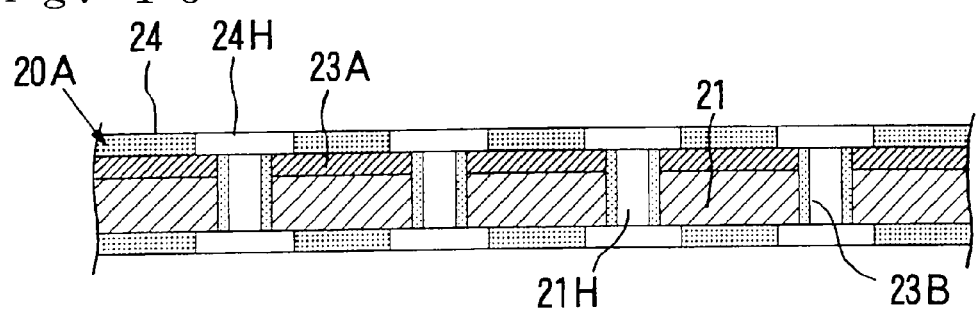
[FIG. 16] is a cross-sectional view illustrating a state that resist films have been formed on the composite laminate material.
Figure 17:
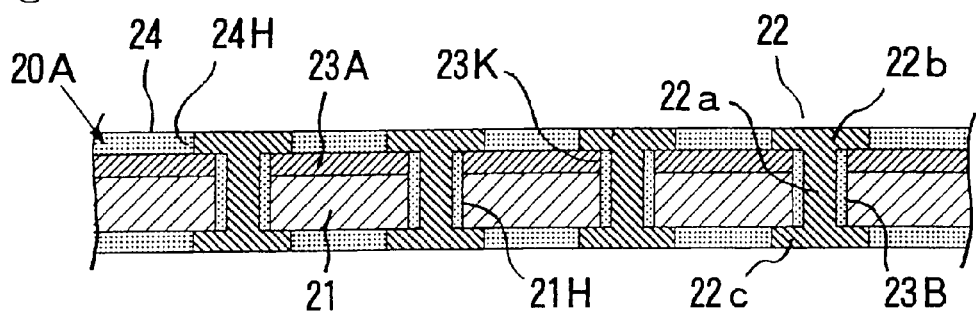
[FIG. 17] is a cross-sectional view illustrating a state that electrode structures have been formed in through-holes in the insulating sheet in the composite laminate material.

This composite laminate material 20A is then subjected to a photo-plating treatment, thereby forming the electrode structures 22 in the respective through-holes 21H in the insulating sheet 21. Specifically, resist films 24, in which a plurality of pattern holes 24K respectively linked to the through-holes 21H in the insulating sheet 21 have been formed in accordance with a pattern corresponding to a pattern of electrode parts 22b and 22c in the electrode structures 22 to be formed, are respectively formed on the surface of the metal layer 23A formed on one surface of the insulating sheet 21 and the other surface of the insulating sheet 21 as illustrated in FIG. 16. An electroplating treatment is then conducted by using the metal layer 23A as a common electrode to deposit a metal on exposed portions in the metal layer 23A and the surfaces of the thin metal layers 23B so as to fill the metal into the through-holes 21H in the insulating sheet 21 and the pattern holes 24K in the resist films 24, thereby forming the electrode structures 22 each extending in the thickness-wise direction of the insulating sheet 21 as illustrated in FIG. 17.

Figure 18:
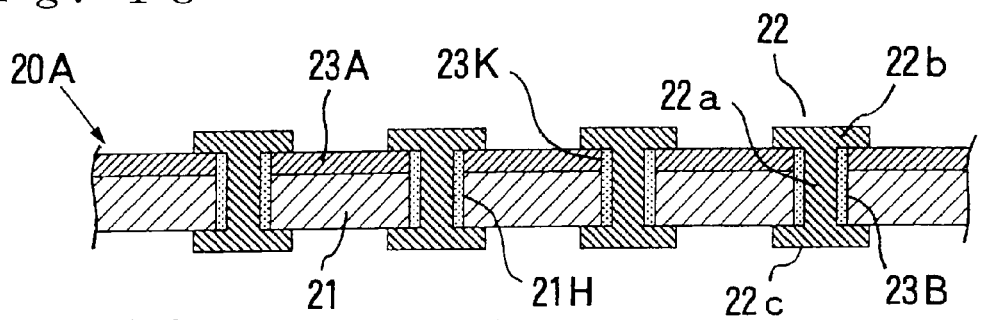
[FIG. 18] is a cross-sectional view illustrating a state that the resist films have been removed from the composite laminate material.

After the electrode structures 22 are formed in such a manner, the resist film 24 is removed from the surface of the metal layer 23A, thereby exposing the metal layer 23A as illustrated in FIG. 18. An etching treatment is then conducted to remove the metal layer 23A and the thin metal layers 23B, thereby obtaining the sheet-like connector 20.

According to the above-described anisotropically conductive connector device 10, each of the electrode structures 22 in the sheet-like connector 20 is movable in the thickness-wise direction of the insulating sheet 21, so that even when a scatter occurs on the projected height of the electrode parts 22b, 22c in the electrode structures 22, the electrode structure moves in the thickness-wise direction of the insulating sheet 20 according to the projected height of the electrode part 22b, 22c thereof when electrodes to be inspected are pressurized. Accordingly, the irregularity-absorbing property of two elastic anisotropically conductive films are sufficiently developed, and thus a good electrically connected state to a circuit device can be surely achieved.

In addition, each of the electrode parts 22b, 22c in the electrode structure 22 has a diameter greater than the diameter of the through-hole 21H in the insulating sheet 21, so that the electrode parts 22b, 22c each function as a stopper. As a result, the electrode structures 22 can be prevented from falling off from the insulating sheet 21.

Further, the insulating sheet 21 of the sheet-like connector 20 is integrally fixed to the insulating part 14, 17 of the elastic anisotropically conductive film 10A, 10C, so that occurrence of positional deviation between the electrode structures 22 of the sheet-like connector 20 and the conductive path-forming parts 11 of the elastic anisotropically conductive film 10A due to a difference in the coefficient of thermal expansion between a material for forming the elastic anisotropically conductive film 10A, 10C and a material for forming the insulating sheet 21 is prevented even when the anisotropically conductive connector device is used under a high-temperature environment. Accordingly, a good electrically connected state is stably retained.

Figure 19:
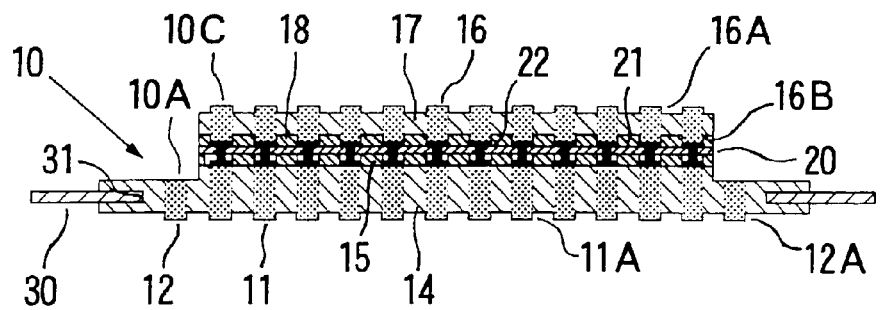
[FIG. 19] is a cross-sectional view illustrating another exemplary anisotropically conductive connector device according to the present invention.
Figure 20:
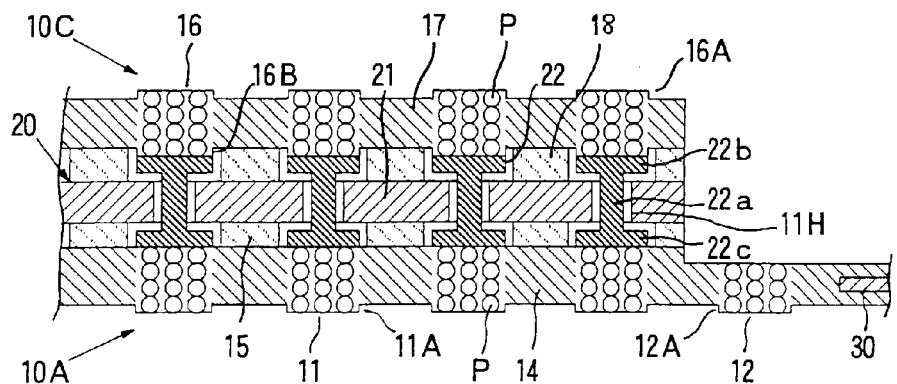
[FIG. 20] is a cross-sectional view illustrating, on an enlarged scale, a part of the anisotropically conductive connector device shown in FIG. 19.
Figure 21:
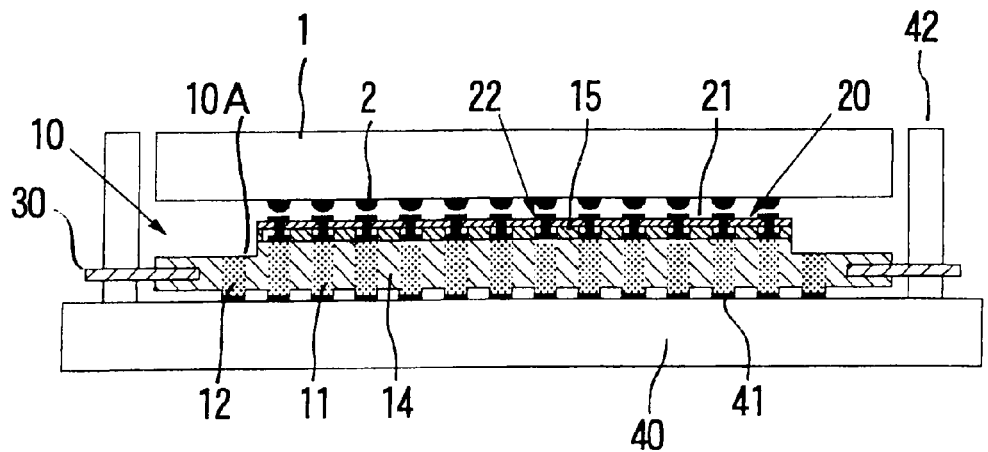
[FIG. 21] illustrates the construction of an exemplary inspection apparatus for circuit devices according to the present invention together with a circuit device.

FIG. 19 is a cross-sectional view illustrating the construction of another exemplary anisotropically conductive connector device according to the present invention, and FIG. 20 is a cross-sectional view illustrating, on an enlarged scale, a part of the anisotropically conductive connector device shown in FIG. 19. This anisotropically conductive connector device 10 is used in electrical inspection of circuit devices such as IC and LSI. The anisotropically conductive connector device 10 in this embodiment has fundamentally the same construction as the anisotropically conductive connector device 10 shown in FIGS. 1 to 3 except that an elastic anisotropically conductive film 10C is integrally provided on one surface of the sheet-like connector 20.

The elastic anisotropically conductive film 10C has a plurality of columnar conductive path-forming parts 16 each extending in a thickness-wise direction thereof and an insulating part 17 mutually insulating these conductive path-forming parts 16, and the conductive path-forming parts 16 are arranged in accordance with a pattern corresponding to a pattern of electrodes to be inspected.

The elastic anisotropically conductive film 10C is formed by an insulating elastic polymeric substance as a whole, and conductive particles P exhibiting magnetism are contained in the conductive path-forming parts 16 thereof in a state oriented so as to align in the thickness-wise direction. On the other hand, the conductive particles are not present at all or scarcely present in the insulating part 17.

Projected parts 16A and 16B protruding from the surface of the insulating part 17 are formed at the surfaces of the conductive path-forming parts 16 on both surfaces of the elastic anisotropically conductive film 10C.

In the elastic anisotropically conductive film 10C, the thickness of the conductive path-forming parts 16 is, for example, 0.1 to 2 mm, preferably 0.2 to 1 mm.

The diameter of the conductive path-forming parts 16 is suitably preset according to the pitch of electrodes to be inspected, and the like and is, for example, 50 to 1,000 μm, preferably 200 to 800 μm.

As the elastic polymeric substance and conductive particles forming the elastic anisotropically conductive film 10C, may be used the same substance and particles as in the elastic anisotropically conductive film 10A.

The elastic anisotropically conductive film 10C is provided in a state that each of the conductive path-forming parts 16 has been positioned on each of the electrode structures 22 of the sheet-like connector 20 and in a state that the insulating part 17 has been integrally fixed to the insulating sheet 21 of the sheet-like connector 20 through an adhesive layer 18. As a material for forming the adhesive layer 18, may be used the same material as in the adhesive layer 15.

According to the above-described anisotropically conductive connector device 10, each of the electrode structures 22 in the sheet-like connector 20 is movable in the thickness-wise direction of the insulating sheet 21, so that even when a scatter occurs on the projected height of the electrode parts 22b, 22c in the electrode structures 22, the electrode structure 22 moves in the thickness-wise direction of the insulating sheet 20 according to the projected height of the electrode part 22b, 22c thereof when electrodes to be inspected are pressurized. Accordingly, a good electrically connected state to a circuit device can be surely achieved.

In addition, each of the electrode parts 22b, 22c in the electrode structure 22 has a diameter greater than the diameter of the through-hole 21H in the insulating sheet 21, so that the electrode parts 22b, 22c each function as a stopper. As a result, the electrode structures 22 can be prevented from falling off from the insulating sheet 21.

Further, the insulating sheet 21 of the sheet-like connector 20 is integrally fixed to the insulating part 14 of the elastic anisotropically conductive film 10A, so that occurrence of positional deviation between the electrode structures 22 of the sheet-like connector 20 and the conductive path-forming parts 11 of the elastic anisotropically conductive film 10A due to a difference in the coefficient of thermal expansion between a material for forming the elastic anisotropically conductive film 10A and a material for forming the insulating sheet 21 is prevented even when the anisotropically conductive connector device is used under a high-temperature environment. Accordingly, a good electrically connected state is stably retained.

FIG. 2i schematically illustrates the construction of an exemplary inspection apparatus for circuit devices according to the present invention.

This inspection apparatus for circuit devices is provided with a circuit board 40 for inspection having guide pins 42. On a front surface (upper surface in FIG. 2l) of this circuit board 40 for inspection, inspection electrodes 41 are formed in accordance with a pattern corresponding to a pattern of electrodes 2 to be inspected in a circuit device 1 that is an object of inspection. Here, the electrodes 2 to be inspected of the circuit device 1 are projected (semispherical) solder ball electrodes.

On the front surface of the circuit board 40 for inspection, is arranged the anisotropically conductive connector device 10 illustrated in FIG. 1. Specifically, the guide pins 42 are inserted into positioning holes 32 (see FIGS. 1 and 4) respectively formed in the support 30 in the anisotropically conductive connector device 10, whereby the anisotropically conductive connector device 10 is fixed on to the front surface of the circuit board 40 for inspection in a state that the conductive path-forming parts 11 in the elastic anisotropically conductive film 10A have been positioned so as to be located on the inspection electrodes 41.

In such an inspection apparatus for circuit device, the circuit device 1 is arranged on the anisotropically conductive connector device 10 in such a manner that the electrodes 2 to be inspected are located on the electrode parts 22b of the electrode structures 22 in the sheet-like connector 20. In this state, for example, the circuit device 1 is pressed in a direction approaching the circuit board 40 for inspection, whereby each of the conductive path-forming parts 11 in the anisotropically conductive connector device 10 is in a state held and pressurized by the electrode structures 22 in the sheet-like connector 20 and the inspection electrode 41. As a result, electrical connection between each of the electrodes 2 to be inspected of the circuit device 1 and its corresponding inspection electrode 41 of the circuit board 40 for inspection is achieved. In this inspection state, the inspection of the circuit device 1 is conducted.

According to the above-described inspection apparatus for circuit devices, a good electrically connected state to the circuit device 1, which is an object of inspection, can be surely achieved even when the pitch of the electrodes 2 to be inspected of the circuit device 1 is extremely small because the anisotropically conductive connector device 10 illustrated in FIG. 1 is arranged. In addition, the good electrically connected state is stably retained even when the apparatus is used under a high-temperature environment, and thus necessary inspection can be surely executed.

The present invention is not limited to the above-described embodiments, and various changes or modifications may be added thereto.

(1) It is not essential to provide the support in the anisotropically conductive connector device 10.

(2) When the anisotropically conductive connector device 10 of the present invention is used in electrical inspection of circuit devices, the elastic anisotropically conductive film may be integrally bonded to the circuit board for inspection. According to such construction, positional deviation between the elastic anisotropically conductive film and the circuit board for inspection can be surely prevented.

Such an anisotropically conductive connector device can be produced by using a mold having a board-arranging space region capable of arranging a circuit board for inspection within a molding cavity as a mold for producing the anisotropically conductive connector device, arranging the circuit board for inspection in the board-arranging space region within the molding cavity of the mold, charging a molding material into, for example, the molding cavity in this state and subjecting the molding material to a curing treatment.

(3) The elastic anisotropically conductive film may be formed by a laminate composed of a plurality of layers different in kind from one another. Specifically, conductive path-forming parts, in which the degrees of elasticity and conductivity are controlled, can be formed by adopting a structure composed of a laminate of a plurality of layers formed by elastic polymeric substances different in hardness from one another, a structure composed of a laminate of a plurality of layers that conductive particles different in kind from one another are contained in respective portions which will become conductive path-forming parts, a structure composed of a laminate of a plurality of layers that conductive particles different in particle diameter from one another are contained in respective portions which will become conductive path-forming parts, or a structure composed of a laminate of a plurality of layers different in the proportion of conductive particles contained in respective portions which will become conductive path-forming parts.

(4) Specific form and structure of the elastic anisotropically conductive film may be variously changed.

For example, the elastic anisotropically conductive film 10A may have, at its central portion, a recess in a surface coming into contact with electrodes to be inspected of a circuit device that is an object of inspection.

The elastic anisotropically conductive film 10A may also have a through-hole at its central portion.

Further, the elastic anisotropically conductive film 10A may be such that the unavailable conductive path-forming parts are formed at a portion supported by the support 30.

Still further, the elastic anisotropically conductive film 10A may be such that the other surface thereof are made flat.

(5) The material for forming the electrode structures 22 in the sheet-like connector 20 is not limited to the metallic materials, and, for example, a material obtained by containing conductive powder such as a metal in a resin may be used.

(6) In the anisotropically conductive connector device according to the present invention, the conductive path-forming parts may be arranged at a fixed pitch irrespective of the pattern of electrodes to be inspected, a part of these conductive path-forming parts may serve as conductive path-forming parts electrically connected to electrodes to be inspected, and the other conductive path-forming parts may serve as unavailable conductive path-forming parts which are not electrically connected to the electrodes to be inspected.

Figure 22:
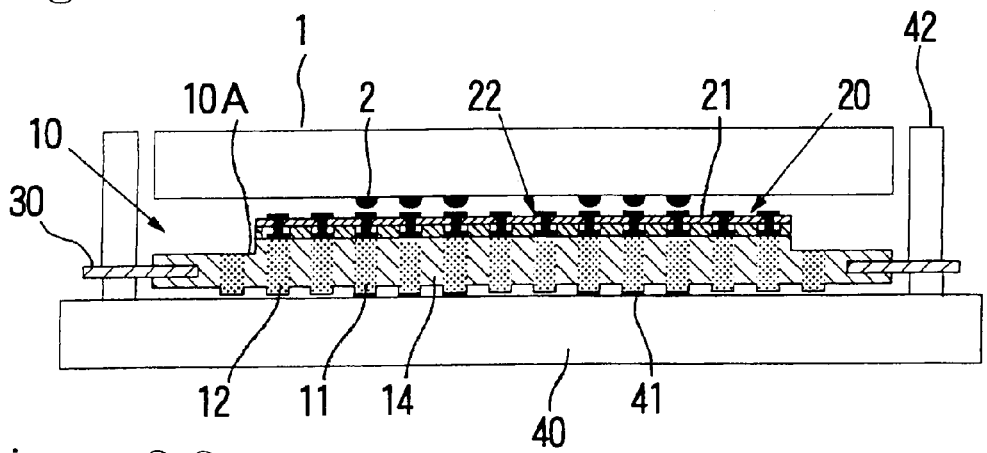
[FIG. 22] illustrates the construction of another exemplary inspection apparatus for circuit devices according to the present invention together with a circuit device.

Specifically described, the circuit devices 1, which are objects of inspection, include those of the construction that electrodes 2 to be inspected are arranged only at partial positions among lattice point positions of a fixed pitch, such as, for example, CSP (chip scale package) and TSOP (thin small outline package), as illustrated in FIG. 22. In an anisotropically conductive connector device 10 for inspecting such a circuit device 1, the conductive path-forming parts may be arranged in accordance with lattice point positions of substantially the same pitch as electrodes 2 to be inspected, conductive path-forming parts located at positions corresponding to the electrodes 2 to be inspected may serve as conductive path-forming parts 11 electrically connected to the electrodes to be inspected, and the other conductive path-forming parts may serve as the unavailable conductive path-forming parts 12.

According to the anisotropically conductive connector device 10 of such constitution, the ferromagnetic substance layers of the mold are arranged at a fixed pitch in the production of such an anisotropically conductive connector device 10, whereby the conductive particles can be efficiently gathered and oriented at prescribed positions by applying a magnetic field to the molding material layer, and the density of the conductive particles in the resulting respective conductive path-forming parts is thereby made even. As a result, an anisotropically conductive connector device small in a difference in resistance value among the respective conductive path-forming parts can be obtained.

(7) Conductive particles formed of a metal or the like, or high-hardness particles such as diamond may be contained in the surfaces (contact surfaces with electrodes to be inspected) of the electrode parts 22b of the electrode structures 22 in the sheet-like connector 20.

These particles may be contained in the electrode parts of the electrode structures 22 by containing them in a plating solution upon the formation of the electrode structures. Alternatively, these particles may be contained in the surfaces of the electrode parts 22b of the electrode structures 22 by conducting plating with a plating solution containing the particles after the electrode structures 22 are formed.

(8) An insulating film may be integrally provided on the surface of the insulating part 14 in the elastic anisotropically conductive film 10A of the anisotropically conductive connector device 10.

For example, a polyimide film having through-holes corresponding to a pattern of the conductive path-forming parts may be integrally provided on a surface of the elastic anisotropically conductive film 10A in the anisotropically conductive connector device 10, on which the sheet-like connector 20 is not arranged, in such a manner that the projected parts of the conductive path-forming parts are projected from the through-holes in the polyimide film.

By integrally providing the polyimide film on the insulating part 14 of the elastic anisotropically conductive film 10A in such a manner, conductive particles separated off from the conductive path-forming parts are prevented from adhering to the insulating part upon repeated use in inspection, and so the insulating property of the insulating part is retained. As a result, it is useful to improve durability in repeated use.

(9) In the anisotropically conductive connector device illustrated in FIGS. 19 and 20, the so-called dispersion type anisotropically conductive elastomer sheet that conductive particles are contained in an elastic polymeric substance in a state oriented so as to align in a thickness-wise direction of the sheet to form chains, and the chains by the conductive particles are contained in a state distributed in a plane direction may be used as the elastic anisotropically conductive film 10C arranged on the sheet-like connector 20.

EXAMPLES

The present invention will hereinafter be described specifically by the following examples. However, the present invention is not limited to the following examples.

In the following examples and comparative examples, that of a two-pack type that the viscosity of Liquid A is 500 Pa·s, the viscosity of Liquid B is 500 Pa·s, and a cured product thereof has a compression set of 6%, a durometer A hardness of 42 and tear strength of 30 kN/m was used as addition type liquid silicone rubber.

The properties of the addition type liquid silicone rubber were determined in the following manner.

(1) Viscosity of Addition Type Liquid Silicone Rubber:

A viscosity at 23±2° C. was measured by a Brookfield viscometer.

(2) Compression Set of Cured Product of Silicone Rubber:

Liquid A and Liquid B in the addition type liquid silicone rubber of the two-pack type were stirred and mixed in proportions that their amounts become equal. After this mixture was then poured into a mold and subjected to a defoaming treatment by pressure reduction, a curing treatment was conducted under conditions of 120° C. and 30 minutes, thereby producing a columnar body having a thickness of 12.7 mm and a diameter of 29 mm and composed of a cured product of the silicone rubber. The columnar body was post-cured under conditions of 200° C. and 4 hours. The columnar body thus obtained was used as a specimen to measure its compression set at 150±2° C. in accordance with JIS K 6249.

(3) Tear Strength of Cured Product of Silicone Rubber:

A curing treatment and post-curing of the addition type liquid silicone rubber were conducted under the same conditions as in the item (2), thereby producing a sheet having a thickness of 2.5 mm. A crescent type specimen was prepared by punching from this sheet to measure its tear strength at 23±2° C. in accordance with JIS K 6249.

(4) Durometer Hardness of Cured Product of Silicone Rubber:

Five sheets produced in the same manner as in the item (3) were stacked on one another, and the resultant laminate was used as a specimen to measure its durometer A hardness at 23±2° C. in accordance with JIS K 6249.

Example 1

(a) Production of Support

A support of the construction shown in FIG. 4 was produced in accordance with the following conditions.

The support (30) is such that its material is SUS304, the thickness is 0.15 mm, the size of an opening (31) is 12 mm×12 mm, and positioning holes (32) are provided at four corners.

(b) Production of Mold

A mold for molding an elastic anisotropically conductive film of the construction shown in FIG. 6 was produced in accordance with the following conditions.

Ferromagnetic substance substrates (51, 56) of both top force (50) and bottom force (55) are such that their materials are iron, and the thickness is 6 mm.

Ferromagnetic substance layers (52, 57) of both top force (50) and bottom force (55) are such that their materials are nickel, the diameter is 0.45 mm (circular), the thickness is 0.1 mm, the arrangement pitch (center distance) is 0.8 mm, and the number of the ferromagnetic substance layers in each force is 144 (12×12).

Non-magnetic substance layers (53, 58) of both top force (50) and bottom force (55) are such that their materials are dry film resists subjected to a curing treatment, the thickness of the non-magnetic substance layers (53) of the top force (50) is 0.1 mm, and the thickness of the non-magnetic substance layers (58) of the bottom force (55) is 0.15 mm.

In the top force (50), a recess (54) formed in the molding surface is 10 mm×10 mm in length and width dimensions and 0.37 mm in depth.

(c) Preparation of Molding Material

Sixty parts by weight of conductive particles having an average particle diameter of 30 μm were added to and mixed with 100 parts by weight of the addition type liquid silicon rubber. Thereafter, the resultant mixture was subjected to a defoaming treatment by pressure reduction, thereby preparing a molding material. In the above-described process, those (average coating amount: 20% by weight of the weight of core particles) obtained by plating core particles composed of nickel with gold were used as the conductive particles.

(d) Formation of Anisotropically Conductive Film

The molding material was charged into the recess (54) in the top force (50) of the above-described mold, whereby a molding material layer (10B) with the conductive particles exhibiting magnetism contained in the polymeric substance-forming material was formed in the recess (54). On the other hand, a spacer (61) having a thickness of 0.1 mm, in which an opening of 16 mm×16 mm in dimensions had been formed, was arranged in alignment on a molding surface of the bottom force (55) of the mold, the support (30) was arranged in alignment on this spacer (61), a spacer (60) having a thickness of 0.1 mm, in which an opening of 16 mm×16 mm in dimensions had been formed, was arranged in alignment on the support (30), and the molding material prepared was applied by screen printing, thereby forming a molding material layer (10B) having a thickness of 0.35 mm in a cavity defined by the bottom force (55), spacers (60, 61) and support (30) (see FIGS. 7 and 8).

The top force (50) was then arranged in alignment on the spacer (60), thereby forming a molding material layer (10B) of a final form in the mold (see FIG. 9).

The molding material layer (10B) formed between the top force (50) and the bottom force (55) was then subjected to a curing treatment under conditions of 100° C. and 1 hour while applying a magnetic field of 2 T to portions located between the ferromagnetic substance layers (52, 57) in the thickness-wise direction by electromagnets, thereby forming an elastic anisotropically conductive film (10A).

The resultant elastic anisotropically conductive film (10A) is such that it is in the form of a rectangle of 16 mm×16 mm in dimensions, has 144 (12×12) conductive path-forming parts (11), each of the conductive path-forming parts (11) has a diameter of 0.45 mm, and an arrangement pitch (center distance) of the conductive path-forming parts (11) is 0.8 mm, and a peripheral edge portion thereof is fixed and supported by the support (30).

(e) Production of Sheet-Like Connector

A laminate material (20B) obtained by integrally laminating a metal layer (23A) having a thickness of about 40 μm and composed of copper on one surface of an insulating sheet (21) having a thickness of 50 μm and composed of a liquid crystal polymer was provided (see FIG. 12), and a dry film resist was laminated on the metal layer (23A) of this laminate material (20B), thereby forming a resist film. In this example, the laminate material (20B) was produced by subjecting a copper layer of a sheet material "Espanex LC18-25-00NE" (product of Nippon Steel Chemical Co., Ltd.) with a copper layer having a thickness of 18 μm formed on a liquid crystal polymer sheet having a thickness of 25 μm to a copper plating treatment to increase the thickness of the copper layer to about 40 μm.

The thus-formed resist film was then subjected to an exposure treatment and a development treatment, whereby 144 (12×12) circular pattern holes were formed with them lined vertically and laterally. The diameter of each of the pattern holes is 40 μm, and a pitch thereof is 0.8 mm.

The metal layer (23A) was then subjected to an etching treatment, whereby openings (23K) of the same pattern as the pattern holes in the resist film were formed in the metal layer (23A), and the resist film was then removed (see FIG. 13).

The insulating sheet (21) in the laminate material (20B) was subjected to laser beam machining through the openings (23K) formed in the metal layer (23A) by means of a $CO_2$ laser beam machine, thereby forming through-holes 21H respectively linked to the openings (23K) in the metal layer (23A) (see FIG. 14).

The inner wall surfaces of the through-holes (21H) in the insulating sheet (21) were subjected to an electroless plating treatment with copper, and additionally to an electroplating treatment with copper using the metal layer (23A) as a common electrode, whereby cylindrical thin metal layers (23B) composed of copper and having a thickness of 5 μm were formed so as to cover the inner wall surfaces of the through-holes (21H) in the insulating sheet (21) and the opening edges of the metal layer (23A), thus producing a composite laminate material (20A) (see FIG. 15). In this process, the diameter of the through-holes (21H) after the thin metal layers (23B) were formed was about 30 μm.

After dry film resists having a thickness of 25 μm were then laminated on both surfaces (the surface of the metal layer (23A) formed on one surface of the insulating sheet (21) and the other surface of the insulating sheet (21)) of the composite laminate material (20A), an exposure treatment and a development treatment were conducted, thereby forming resist films (24), in which 144 circular pattern holes (24H) linked to the respective through-holes (21H) in the insulating sheet (21) and having a diameter of 50 μm were formed (FIG. 16).

Thereafter, a plating solution with nickel sulfamate dissolved therein was used to conduct an electroplating treatment using the metal layer (23A) as a common electrode, thereby forming electrode structures (22) each composed of nickel (see FIG. 17).

The surfaces of the electrode parts (22b, 22c) of the electrode structures (22) were polished, whereby these surfaces were smoothened, and at the same time the thickness of electrode parts (22b, 22c) was caused to conform to the thickness of the resist films.

After the resist films (24) were then removed from both surfaces of the composite laminate material (20A), the composite laminate material (20A) was subjected to an etching treatment under conditions of 60° C. and 3 hours using an etchant with ferric chloride dissolved therein, thereby removing the metal layer (23A) and the thin metal layers (23B), thus producing a sheet-like connector (20).

The resultant sheet-like connector (20) is such that the material of the insulating sheet (21) is a liquid crystal polymer, the dimensions thereof are 10 mm in length, 10 mm in width and 50 µm in thickness d, the diameter r1 of the through-holes 21H is 40 µm, the total number of the electrode structures (22) is 144, the diameter r2 of each body part (22a) is 30 µm, the diameter r3 of each electrode part (22b, 22c) is 50 µm, the length L of the body part (22a) is 95 µm, the thickness of each electrode part (22b, 22c) is about 40 µm, and the movable distance (L−d) of the electrode structure (22) is 45 µm.

(f) Production of Anisotropically Conductive Connector Device

A silicone adhesive was applied to the surface of the insulating part (14) in the elastic anisotropically conductive film (10A), the sheet-like connector (20) was stacked in alignment on the elastic anisotropically conductive film (10A), and the sheet-like connector (20) and the elastic anisotropically conductive film (10A) were then heated while pressurizing them in the thickness-wise direction to cure the silicone adhesive, thereby producing an anisotropically conductive connector device (10) with the insulating sheet (21) in the sheet-like connector (20) integrally fixed to the surface of the elastic anisotropically conductive film (10A) through the adhesive layer (15).

(g) Test

The following circuit device for test was provided.

This circuit device has forty-eight electrode to be inspected composed of solder balls each having a diameter of 0.4 mm and a height of 0.3 mm in total. In this circuit device, two electrode groups each obtained by arranging twenty-four electrodes to be inspected were formed. In each electrode group, two electrode rows in total, which were each composed of twelve electrodes to be inspected aligned at a pitch of 0.8 mm, were formed. Every two electrodes of these electrodes to be inspected are electrically connected to each other by an internal wiring in the circuit device. The number of internal wirings in the circuit device was twenty-four in total.

The above-described circuit device was used to evaluate the anisotropically conductive connector device in the following manner.

Figure 23:
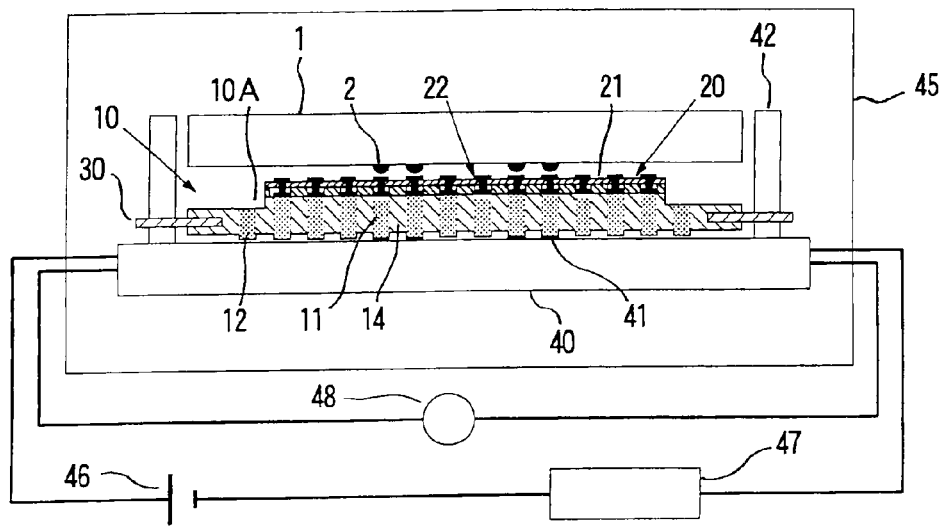
[FIG. 23] illustrates the construction of a testing apparatus used in Examples together with a circuit device.
Figure 24:
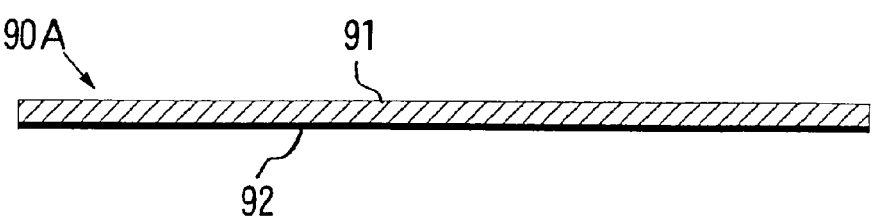
[FIG. 24] is a cross-sectional view illustrating a process for producing a sheet-like connector in a conventional anisotropically conductive connector device.
Figure 24:
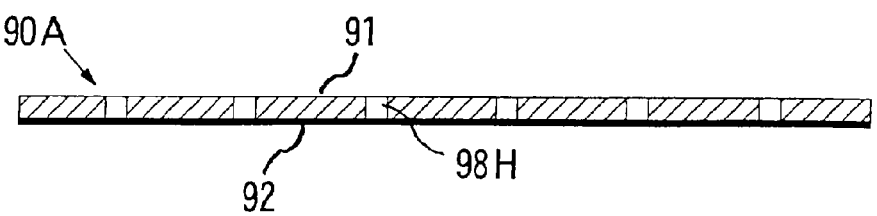
Figure 24:
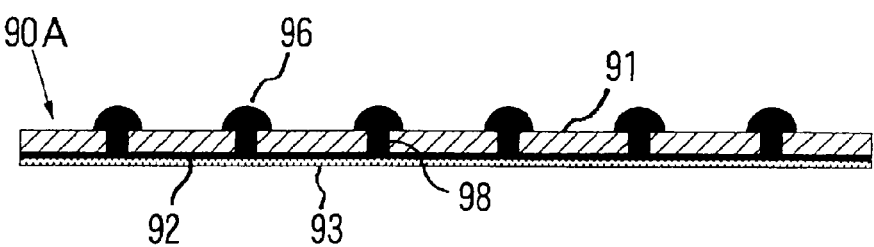
Figure 24:
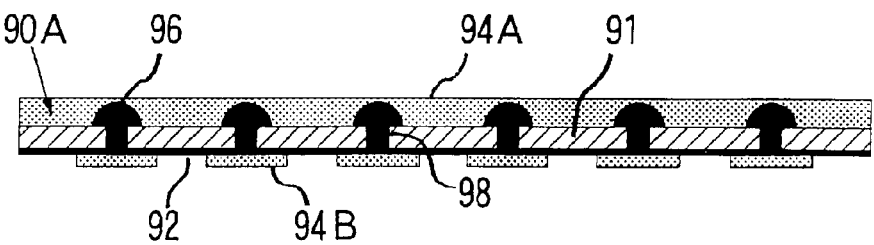
Figure 24:
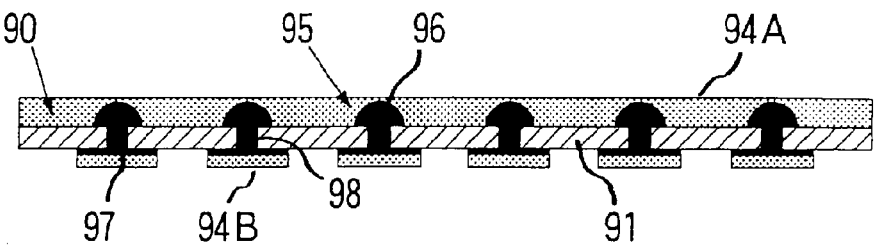
Figure 25:
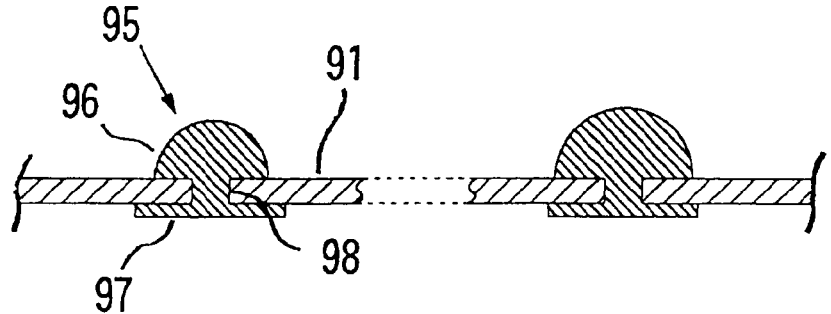
[FIG. 25]($a$) is a cross-sectional view illustrating, on an enlarged scale, electrode structures in the sheet-like connector in the conventional anisotropically conductive connector device, ($b$) is a cross-sectional view illustrating a state that front-surface electrode parts have come into contact with respective electrodes to be inspected, and ($c$) is a cross-sectional view illustrating a state that a contact failure has occurred between the front-surface electrode part and the electrode to be inspected.
Figure 25:
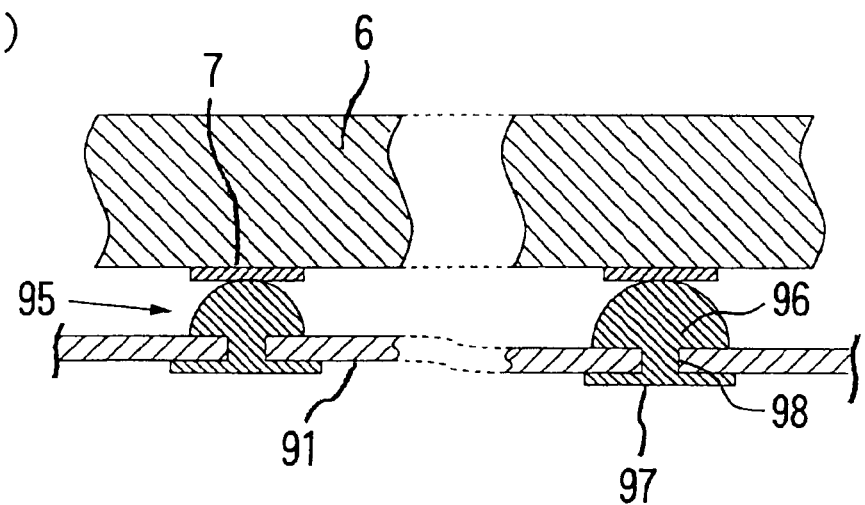
Figure 25:
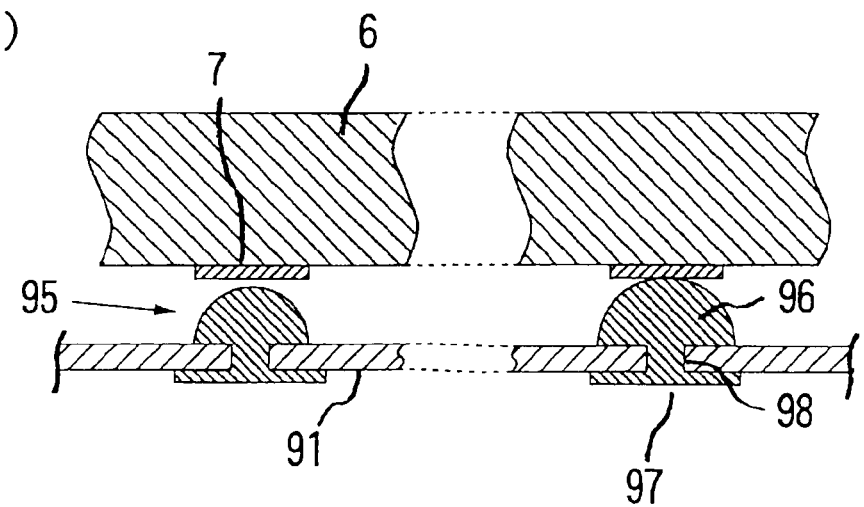

As illustrated in FIG. 23, the anisotropically conductive connector device (10) was arranged in alignment on the circuit board (40) for inspection by inserting the guide pins (42) of the circuit board (40) for inspection into the positioning holes of the support (30) in the anisotropically conductive connector device (10), and the circuit device (1) for test was arranged on this anisotropically conductive connector device (10) and these members were fixed by pressuring jig (not shown). In this state, the assembly was arranged in a thermostatic oven (45).

The temperature of the thermostatic oven (45) was then set to 100° C., and a DC current of 10 mA was always applied between external terminals (not illustrated) of the circuit board (40) for inspection, which were electrically connected to each other through the anisotropically conductive connector device (10), the circuit device (1) for test, and the inspection electrodes (41) of the circuit board (40) for inspection and wirings (not illustrated) thereof by means of a DC power source (46) and a constant-current controller (47) while repeating pressurization at a pressurizing cycle of 5 sec/stroke by a pressuring jig in such a manner that a distortion factor of the conductive path-forming parts (11) of the anisotropically conductive film (10A) in the anisotropically conductive connector device (10) is 30% (thickness of the conductive path-forming parts upon pressurization: 0.55 mm), thereby measuring a voltage between the external terminals of the circuit board (40) for inspection upon the pressurization by a voltmeter (48).

Supposing that a voltage value (V) measured in such a manner is V1, and the DC current applied is I1 (=10 mA), an electric resistance value R1 was found in accordance with the following expression:

$$R1 = V1/I1.$$

Here, the electric resistance value R1 includes an electric resistance value between the electrodes of the circuit device for test and an electric resistance value between the external terminals of the circuit board for inspection in addition to an electric resistance value between two conductive path-forming parts.

Since electrical inspection of the circuit device became difficult in fact when the electric resistance value R1 was higher than 1Ω, the measurement of the voltage was continued until the electric resistance value R1 becomes greater than 1Ω.

The number of times of the measurement (the number of times of the current application) up to the time the electric resistance value R1 of one of the twenty-four internal wirings in the circuit device exceeded 1Ω was recorded. However, the measurement of the voltage was completed at 100,000 times.

The result thereof is shown in Table 1.

Comparative Example 1

The same test as in Example 1 was made except that an elastic anisotropically conductive film provided with a support around its periphery produced in the same manner as in Example 1 was used in place of the anisotropically conductive connector device. The result thereof is shown in Table 1.

TABLE 1

| | Number of Times of Measurement up to Electric Resistance Value R1 Exceeded 1Ω |
|---|---|
| Example 1 | 100,000 times or more |
| Comparative Example 1 | 20,000 times |

The invention claimed is:

1. An anisotropically conductive connector device comprising:
    an elastic anisotropically conductive film, in which a plurality of conductive path-forming parts including conductive particles contained in an elastic polymeric substance and each extending in a thickness-wise direction of the film are arranged mutually insulated by an insulating part composed of the elastic polymeric substance; and
    a sheet-like connector including an insulating sheet, including a plurality of through-holes each extending in a thickness-wise direction of the insulating sheet, and a plurality of electrode structures arranged in the respective through-holes in the insulating sheet so as to protrude from both surfaces of the insulating sheet,
    wherein in the sheet-like connector each of the electrode structures is positioned on each of the conductive path-forming parts of the elastic anisotropically conductive film and the insulating sheet is integrally fixed to the insulating part of the elastic anisotropically conductive film, and wherein each of the electrode structures includes electrode parts having a diameter greater than the diameter of each of the through-holes in the insulating sheet on both ends of a body part inserted into the through-hole in the insulating sheet, and the body part has a greater length than a thickness of the insulating sheet, and a diameter of the body part is less than a diameter of the through-hole into which the body part is inserted, and the electrode structure is movable in the thickness-wise direction of the insulating sheet.

2. The anisotropically conductive connector device according to claim 1, further comprising a support for supporting the peripheral edge portion of the elastic anisotropically conductive film.

3. The anisotropically conductive connector device according to claim 1, further comprising another elastic anisotropically conductive film, in which a plurality of conductive path-forming parts including conductive particles in an elastic polymeric substance and each extending in a thickness-wise direction of the film are arranged mutually insulated by an insulating part including the elastic polymeric substance, and each of the conductive path-forming parts is positioned on each of the electrode structures of the sheet-like connector and the insulating part is integrally fixed to the insulating sheet of the sheet-like connector.

4. An inspection apparatus for circuit boards, comprising:
a circuit device for inspection having inspection electrodes arranged corresponding to electrodes to be inspected of a circuit device, which is an object of inspection, and
the anisotropically conductive connector device according to claim 1, which is arranged on the circuit board for inspection.

5. The anisotropically conductive connector device according to claim 2, further comprising another elastic anisotropically conductive film, in which a plurality of conductive path-forming parts including conductive particles in an elastic polymeric substance and each extending in a thickness-wise direction of the film are arranged mutually insulated by an insulating part including the elastic polymeric substance, and each of the conductive path-forming parts is positioned on each of the electrode structures of the sheet-like connector and the insulating part is integrally fixed to the insulating sheet of the sheet-like connector.

6. An inspection apparatus for circuit boards, comprising:
a circuit device for inspection having inspection electrodes arranged corresponding to electrodes to be inspected of a circuit device, which is an object of inspection, and
the anisotropically conductive connector device according to claim 2, which is arranged on the circuit board for inspection.

7. An inspection apparatus for circuit boards, comprising:
a circuit device for inspection having inspection electrodes arranged corresponding to electrodes to be inspected of a circuit device, which is an object of inspection, and
the anisotropically conductive connector device according to claim 3, which is arranged on the circuit board for inspection.

8. An inspection apparatus for circuit boards, comprising:
a circuit device for inspection having inspection electrodes arranged corresponding to electrodes to be inspected of a circuit device, which is an object of inspection, and
the anisotropically conductive connector device according to claim 5, which is arranged on the circuit board for inspection.

* * * * *